(12) United States Patent
Hanson

(10) Patent No.: US 7,217,325 B2
(45) Date of Patent: *May 15, 2007

(54) SYSTEM FOR PROCESSING A WORKPIECE

(75) Inventor: Kyle M. Hanson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 67 days.

This patent is subject to a terminal disclaimer.

(21) Appl. No.: 10/867,458

(22) Filed: Jun. 14, 2004

(65) Prior Publication Data

US 2004/0241998 A1 Dec. 2, 2004

Related U.S. Application Data

(63) Continuation-in-part of application No. 10/690,864, filed on Oct. 21, 2003, now Pat. No. 6,930,046, which is a continuation-in-part of application No. 10/202,074, filed on Jul. 23, 2002, now Pat. No. 6,794,291, which is a continuation of application No. 09/437,711, filed on Nov. 10, 1999, now Pat. No. 6,423,642, which is a continuation-in-part of application No. PCT/US99/05676, filed on Mar. 15, 1999.

(60) Provisional application No. 60/116,750, filed on Jan. 22, 1999.

(51) Int. Cl.
*B05C 11/02* (2006.01)

(52) U.S. Cl. .......................... 118/52; 134/155; 134/153

(58) Field of Classification Search ............... 438/684; 134/155, 153, 137; 118/900, 52
See application file for complete search history.

(56) References Cited

U.S. PATENT DOCUMENTS

| | | | |
|---|---|---|---|
| 3,727,620 A | 4/1973 | Orr | |
| 3,953,265 A | 4/1976 | Hood | |
| 4,132,567 A | 1/1979 | Blackwood | |
| 4,439,243 A | 3/1984 | Titus | |
| 4,439,244 A | 3/1984 | Allevato | |
| 4,544,446 A | 10/1985 | Cady | |
| 4,664,133 A | 5/1987 | Silvernail et al. | |

(Continued)

FOREIGN PATENT DOCUMENTS

GB 2 184 288 6/1987

(Continued)

OTHER PUBLICATIONS

Patent Cooperation Treaty Search Report for Application No. PCT/US04/34895 dated Apr. 20, 2006.

*Primary Examiner*—Caridad Everhart
(74) *Attorney, Agent, or Firm*—Perkins Coie LLP

(57) ABSTRACT

A system for processing a workpiece includes a process head assembly and a base assembly. The process head assembly has a process head and an upper rotor. The base assembly has a base and a lower rotor. The base and lower rotor have magnets wherein the upper rotor is engageable with the lower rotor via a magnetic force created by the magnets. The engaged upper and lower rotors form a process chamber where a semiconductor wafer is positioned for processing. Process fluids for treating the workpiece are introduced into the process chamber, optionally while the processing head spins the workpiece. Additionally, air flow around and through the process chamber is managed to reduce particle adders on the workpiece.

39 Claims, 21 Drawing Sheets

U.S. PATENT DOCUMENTS

| | | | |
|---|---|---|---|
| 4,750,505 A | 6/1988 | Inuta et al. | |
| 4,779,877 A | 10/1988 | Shaw | |
| 4,790,262 A | 12/1988 | Nakayama et al. | |
| 4,838,289 A | 6/1989 | Kottman et al. | |
| 4,903,717 A | 2/1990 | Sumnitsch | |
| 4,982,215 A | 1/1991 | Matsuoka | |
| 4,982,753 A | 1/1991 | Grebinski, Jr. et al. | |
| 5,020,200 A | 6/1991 | Mimasaka et al. | |
| 5,032,217 A | 7/1991 | Tanaka | |
| 5,040,484 A | 8/1991 | Mears et al. | |
| 5,117,769 A | 6/1992 | DeBoer | |
| 5,168,886 A | 12/1992 | Thompson et al. | |
| 5,209,180 A | 5/1993 | Shoda et al. | |
| 5,222,310 A | 6/1993 | Thompson et al. | |
| 5,224,503 A | 7/1993 | Thompson et al. | |
| 5,224,504 A | 7/1993 | Thompson et al. | |
| 5,249,728 A | 10/1993 | Lam | |
| 5,349,978 A | 9/1994 | Sago et al. | |
| 5,361,449 A | 11/1994 | Akimoto | |
| 5,421,893 A | 6/1995 | Perlov | |
| 5,431,421 A | 7/1995 | Thompson et al. | |
| 5,443,644 A | 8/1995 | Ozawa | |
| 5,445,172 A | 8/1995 | Thompson et al. | |
| 5,500,081 A | 3/1996 | Bergman | |
| 5,513,594 A | 5/1996 | McClanahan et al. | |
| 5,551,986 A | 9/1996 | Jain | |
| 5,591,262 A | 1/1997 | Sago et al. | |
| 5,613,343 A | 3/1997 | Inoue et al. | |
| 5,616,069 A | 4/1997 | Walker et al. | |
| 5,664,337 A | 9/1997 | Davis et al. | |
| 5,666,985 A | 9/1997 | Smith, Jr. et al. | |
| 5,677,824 A | 10/1997 | Harashima et al. | |
| 5,678,116 A | 10/1997 | Sugimoto et al. | |
| 5,718,763 A | 2/1998 | Tateyama et al. | |
| 5,731,678 A | 3/1998 | Zila et al. | |
| 5,762,708 A | 6/1998 | Motoda et al. | |
| 5,762,751 A | 6/1998 | Bleck et al. | |
| 5,779,796 A | 7/1998 | Tomoeda et al. | |
| 5,815,762 A | 9/1998 | Sakai et al. | |
| 5,845,662 A | 12/1998 | Sumnitsch | |
| 5,860,640 A | 1/1999 | Marohl et al. | |
| 5,868,866 A | 2/1999 | Maekawa et al. | |
| 5,882,433 A | 3/1999 | Ueno | |
| 5,885,755 A | 3/1999 | Nakagawa et al. | |
| 5,890,269 A | 4/1999 | Gardner et al. | |
| 5,916,366 A | 6/1999 | Ueyama et al. | |
| 5,942,035 A | 8/1999 | Hasebe et al. | |
| 5,952,050 A | 9/1999 | Doan | |
| 5,969,424 A | 10/1999 | Matsuki et al. | |
| 5,997,653 A | 12/1999 | Yamasaka | |
| 6,139,639 A | 10/2000 | Kitamura et al. | |
| 6,155,969 A * | 12/2000 | Schima et al. | 600/16 |
| 6,213,855 B1 | 4/2001 | Natalicio | |
| 6,264,752 B1 | 7/2001 | Curtis et al. | |
| 6,309,520 B1 | 10/2001 | Woodruff et al. | |
| 6,334,937 B1 | 1/2002 | Batz, Jr. et al. | |
| 6,336,845 B1 | 1/2002 | Engdahl et al. | |
| 6,350,319 B1 | 2/2002 | Curtis et al. | |
| 6,423,642 B1 | 7/2002 | Peace et al. | |
| 6,447,633 B1 | 9/2002 | Peace et al. | |
| 6,454,926 B1 | 9/2002 | Ritzdorf et al. | |
| 6,492,284 B2 | 12/2002 | Peace et al. | |
| 6,511,914 B2 | 1/2003 | Wirth et al. | |
| 6,548,411 B2 | 4/2003 | Wirth et al. | |
| 6,632,292 B1 | 10/2003 | Aegerter et al. | |
| 6,692,613 B2 | 2/2004 | Peace et al. | |
| 6,695,914 B2 | 2/2004 | Curtis et al. | |
| 6,774,056 B2 | 8/2004 | Kuntz et al. | |
| 6,858,088 B1 | 2/2005 | Dress et al. | |
| 6,899,765 B2 | 5/2005 | Krivts et al. | |
| 6,930,046 B2 * | 8/2005 | Hanson et al. | 438/694 |
| 2002/0017237 A1 | 2/2002 | Wirth et al. | |
| 2002/0168863 A1 | 11/2002 | Aegerter et al. | |
| 2003/0136431 A1 | 7/2003 | Scranton et al. | |
| 2003/0176067 A1 | 9/2003 | Wirth et al. | |
| 2004/0129302 A1 | 7/2004 | Hanson et al. | |
| 2005/0211618 A1 | 9/2005 | Tautuhi et al. | |

FOREIGN PATENT DOCUMENTS

| | | |
|---|---|---|
| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1-120023 | 5/1989 |
| JP | 1-283845 | 11/1989 |
| JP | 4-94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| WO | WO 99/46065 | 9/1999 |

* cited by examiner

SYSTEM FOR PROCESSING A WORKPIECE

CROSS-REFERENCE TO RELATED APPLICATIONS

This Application is a Continuation-In-Part of U.S. patent application Ser. No. 10/690,864, filed Oct. 21, 2003 and now U.S. Pat. No. 6,930,046, which is a Continuation-In-Part of U.S. patent application Ser. No. 10/202,074, filed Jul. 23, 2002 and now U.S. Pat. No. 6,794,291, which is a Continuation of U.S. patent application Ser. No. 09/437,711, filed Nov. 10, 1999, now U.S. Pat. No. 6,423,642, which is a Continuation-In-Part and U.S. National Phase of International Patent Application No. PCT/US99/05676, filed Mar. 15, 1999, published in English and designating the United States, and claiming priority to U.S. Patent Application No. 60/116,750, filed Jan. 22, 1999. Priority to these applications is claimed under 35 U.S.C. §§ 119, 120 and/or 365. The above-identified Applications are also incorporated herein by reference.

TECHNICAL FIELD

The invention relates to surface preparation, cleaning, rinsing and drying of workpieces, such as semiconductor wafers, flat panel displays, rigid disk or optical media, thin film heads or other workpieces formed from a substrate on which microelectronic circuits, data storage elements or layers, or micro-mechanical elements may be formed. These and similar articles are collectively referred to herein as a "wafer" or "workpiece." Specifically, the present invention relates to a workpiece processor and system for treating semiconductor workpieces.

BACKGROUND OF THE INVENTION

The semiconductor manufacturing industry is constantly seeking to improve the processes and machines used to manufacture microelectronic circuits and components, such as the manufacture of integrated circuits from wafers. The objectives of many of these improved processes and machines include: decreasing the amount of time required to process a wafer to form the desired integrated circuits; increasing the yield of usable integrated circuits per wafer by, for example, decreasing contamination of the wafer during processing; reducing the number of steps required to create the desired integrated circuits; improving the uniformity and efficiency of processes used to create the desired integrated circuits; and reducing the costs of manufacture.

As the semiconductor industry advances particle "adder" specifications, the number and size of the permitted particulate contamination in the manufacture of semiconductor wafers is continuously being reduced. Existing machines are not sufficient for future particle specifications.

Further, in the processing of wafers, it is often necessary to subject one or more sides of the wafer to a fluid in liquid, vapor or gaseous form. Such fluids are used to, for example, etch the wafer surface, clean the wafer surface, dry the wafer surface, passivate the wafer surface, deposit films on the wafer surface, remove films or masking materials from the wafer surface, etc. Controlling how the processing fluids are applied to the wafer surfaces, reducing the potential for cross contamination of the processing fluids, and effectively cleaning or rinsing process fluids from process chamber surfaces are often important to the success of the processing operations.

SUMMARY OF THE INVENTION

A new wafer processing system has been invented that provides significant improvements in manufacturing microelectronic and similar devices. The new system reduces particle contamination. As a result there are fewer defects in the end products. This reduces the total amount of raw materials, process fluids, time, labor and effort required to manufacture microelectronic devices. Accordingly, the new wafer processing system of the present invention significantly increases manufacturing yields.

A unique workpiece processor design has been invented that significantly reduces cross contamination of process fluids. The unique design also greatly increases the ability to exhaust vapor or fumes and drain process fluids from the process chamber during processing of a semiconductor wafer. Further, the processor of the present invention utilizes a relatively simple, magnetic rotor engagement mechanism that reduces variability of vibration affects caused by variations in manufacturing techniques from one processor to another. As a result of these design improvements, the effects of wafer processing is more consistent from one workpiece processor to the next, and high manufacturing quality standards and increased efficiencies are achieved.

In one embodiment, the wafer processing system of the present invention provides a plurality of workpiece stations for plating, etching, cleaning, passivating, depositing and/or removing films and masking materials from a workpiece surface. The system includes a robot, which is moveable between the workpiece stations and moves the workpiece from one station to another. At least one of the workpiece stations includes a workpiece processor having an upper rotor and a lower rotor engageable to form a workpiece process chamber. A magnetic force between repulsing magnets is utilized to maintain contact between the rotors during operation of the processor. This unique process chamber design reduces vibrations, which have been found to be a major contributor to particulate contamination, and also reduces the chances of process fluids leaking onto the surface of processed wafers, which can result in defects or failure of the microelectronic end products.

The wafer processing system of the present invention has also been designed to increase air flow through the workpiece processor during processing. Better air flow management reduces particle contamination and increases overall processing efficiency. As a result, less time, materials and energy is consumed. Particularly, the processor of the present invention has air flow passageways in the process head, which draws ambient air from the mini-environment surrounding the processor, into the process head, and out through the bottom of the processor. Further, annular channels formed in the base and the upper rim of the base relieve pressure build up in the process chamber. During operation, openings in the upper rim of the base receive "blow-by" fluids. The annular channels bleed the "blow-by" fluids off to an exhaust port, relieving pressure build up. Moreover, an air aspirator is connected to an annulus positioned below the motor in the process head. The aspirator sucks any gaseous fluids that may come from the air flow passageways in the process head or the annular channels in the base. Additionally, a central opening in the process head and upper rotor, and a process fluid nozzle in the base which extends upwardly through an opening in the lower rotor and is connected to a snorkel permits air to be drawn directly into the workpiece processor during operation. As a result of these design improvements, air flow in the process chamber is greatly enhanced, and more uniform processing and increased efficiencies are achieved.

Other features and advantages of the invention will appear hereinafter. The features of the invention described above can be used separately or together, or in various combinations of one or more of them, with no single feature essential to the invention. The invention resides as well in sub-combinations of the features described. The process chamber can be used alone, or in a system with robotic automation and various other process chambers.

DETAILED DESCRIPTION

Figure 1:
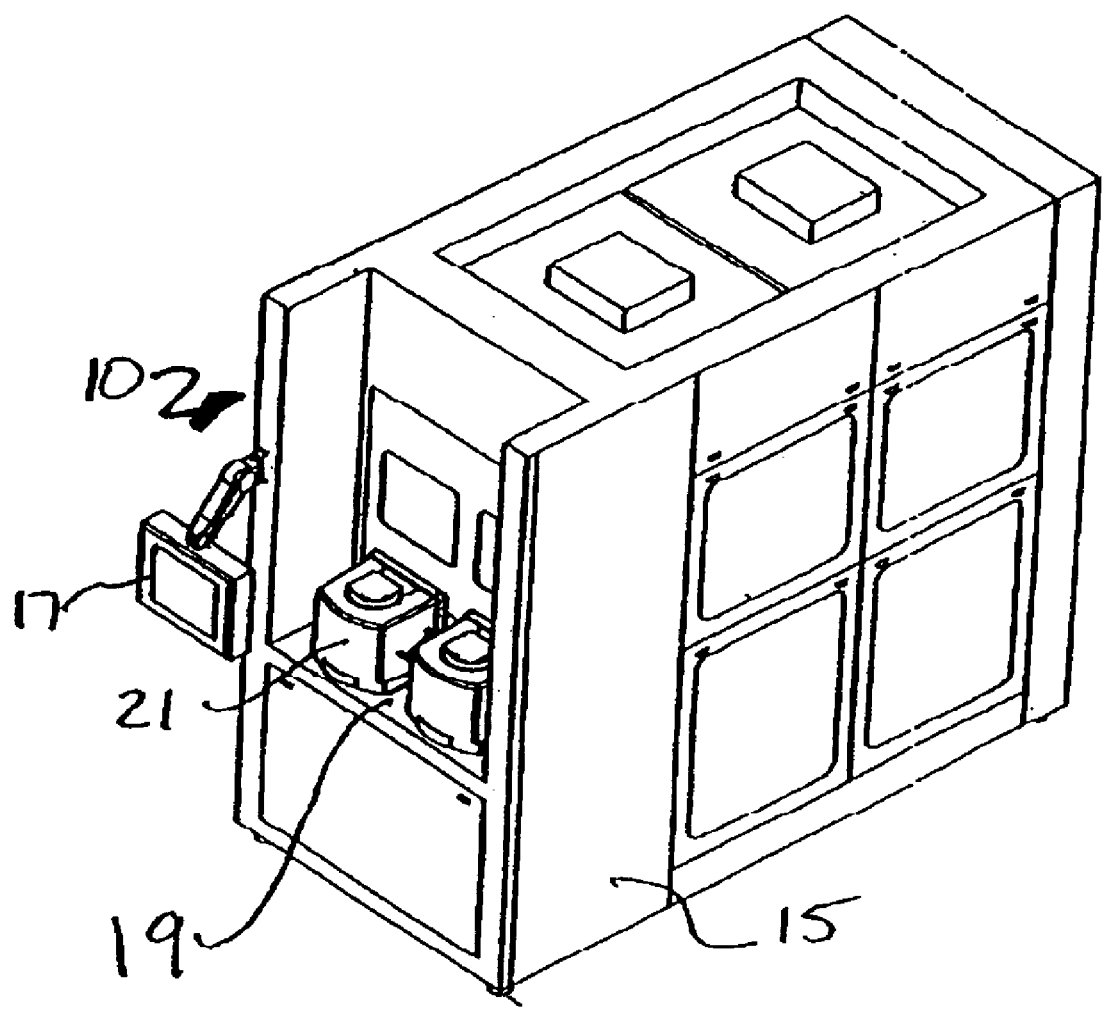
FIG. 1 is a perspective view of a workpiece processing system according to the present invention.
Figure 2:
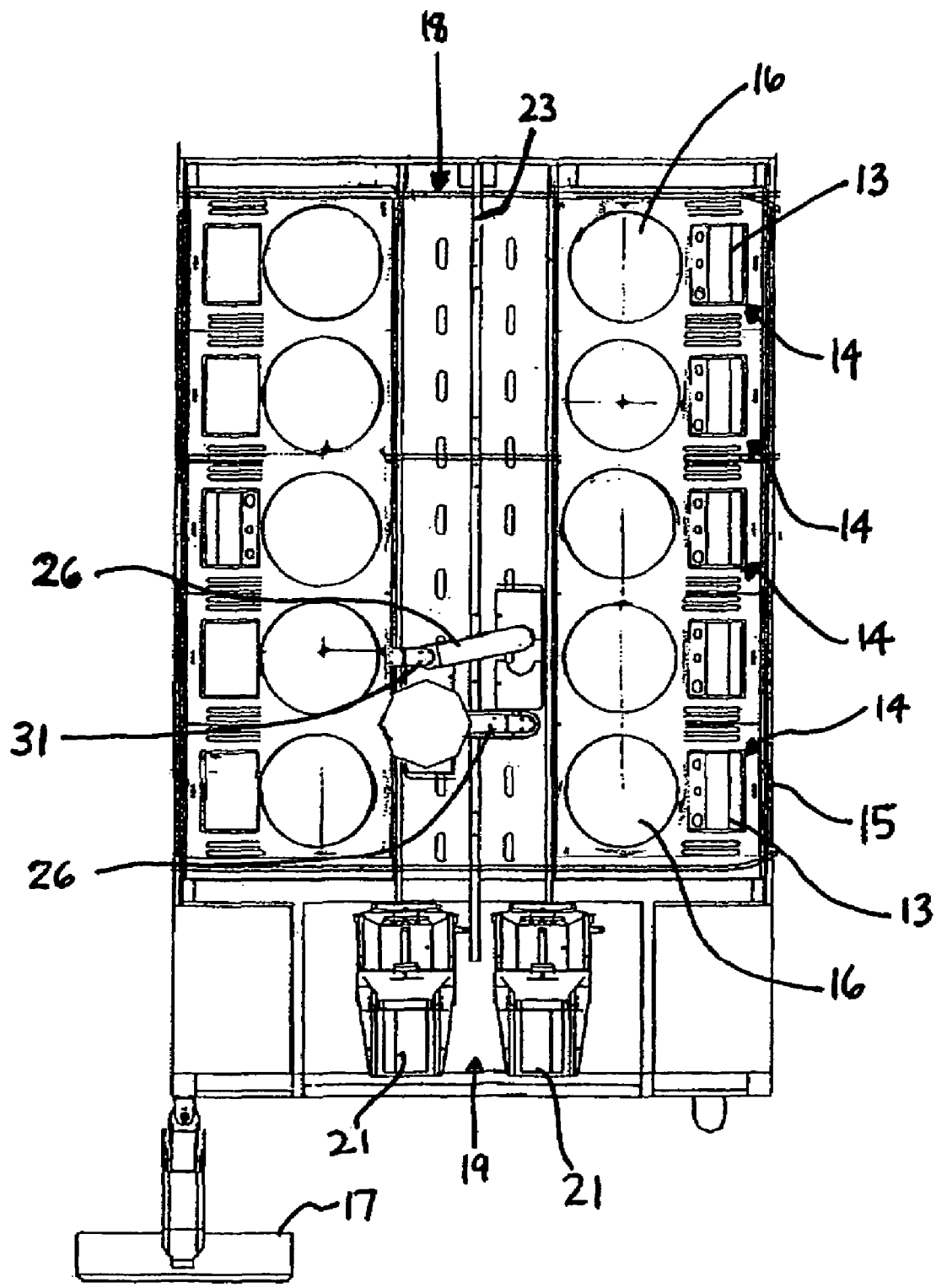
FIG. 2 is a top plan view of the workpiece processing system shown in FIG. 1, with components removed for purpose of illustration.
Figure 3:
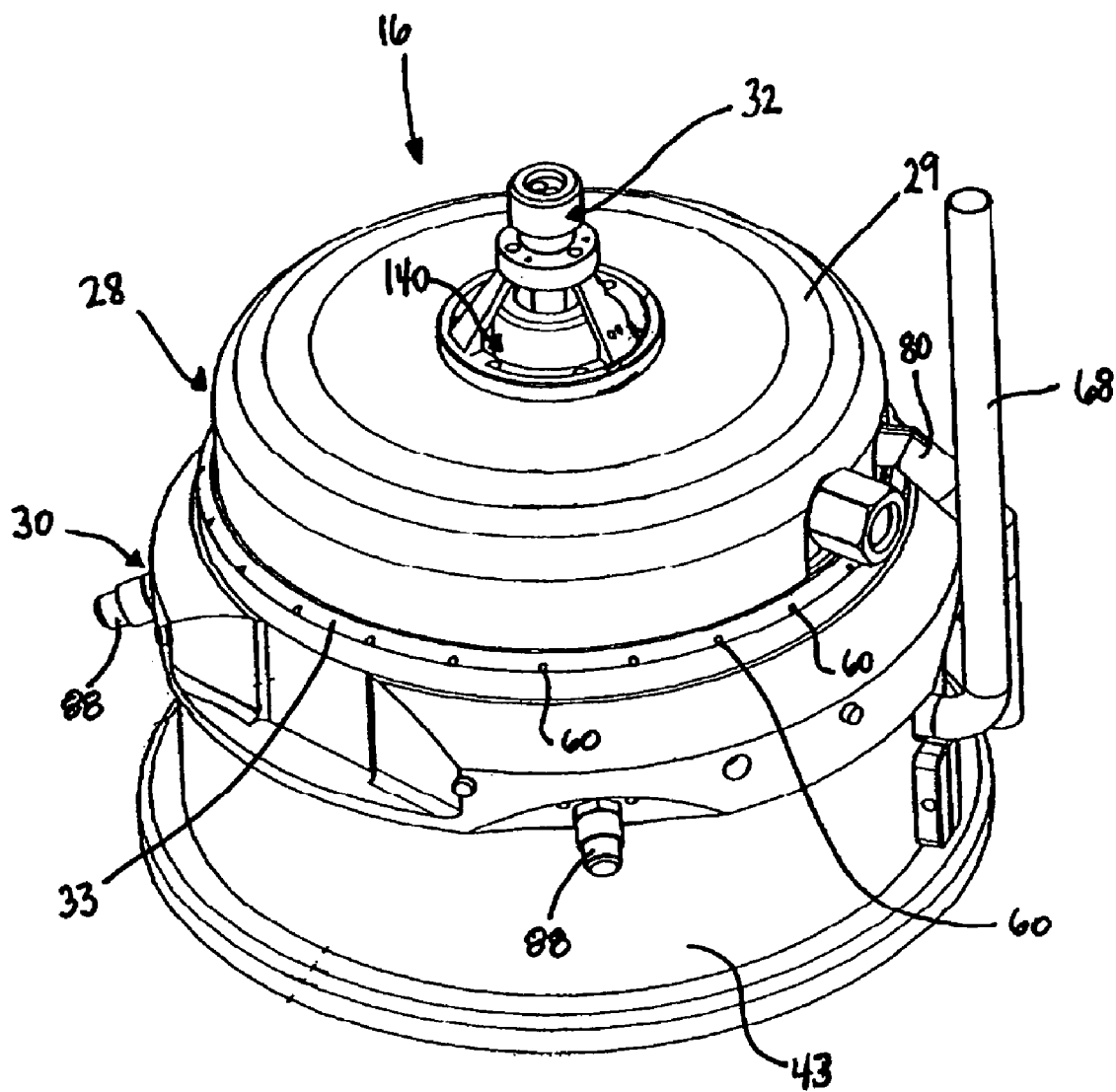
FIG. 3 is a perspective view of a workpiece processor according to one embodiment of the present invention.
Figure 4:
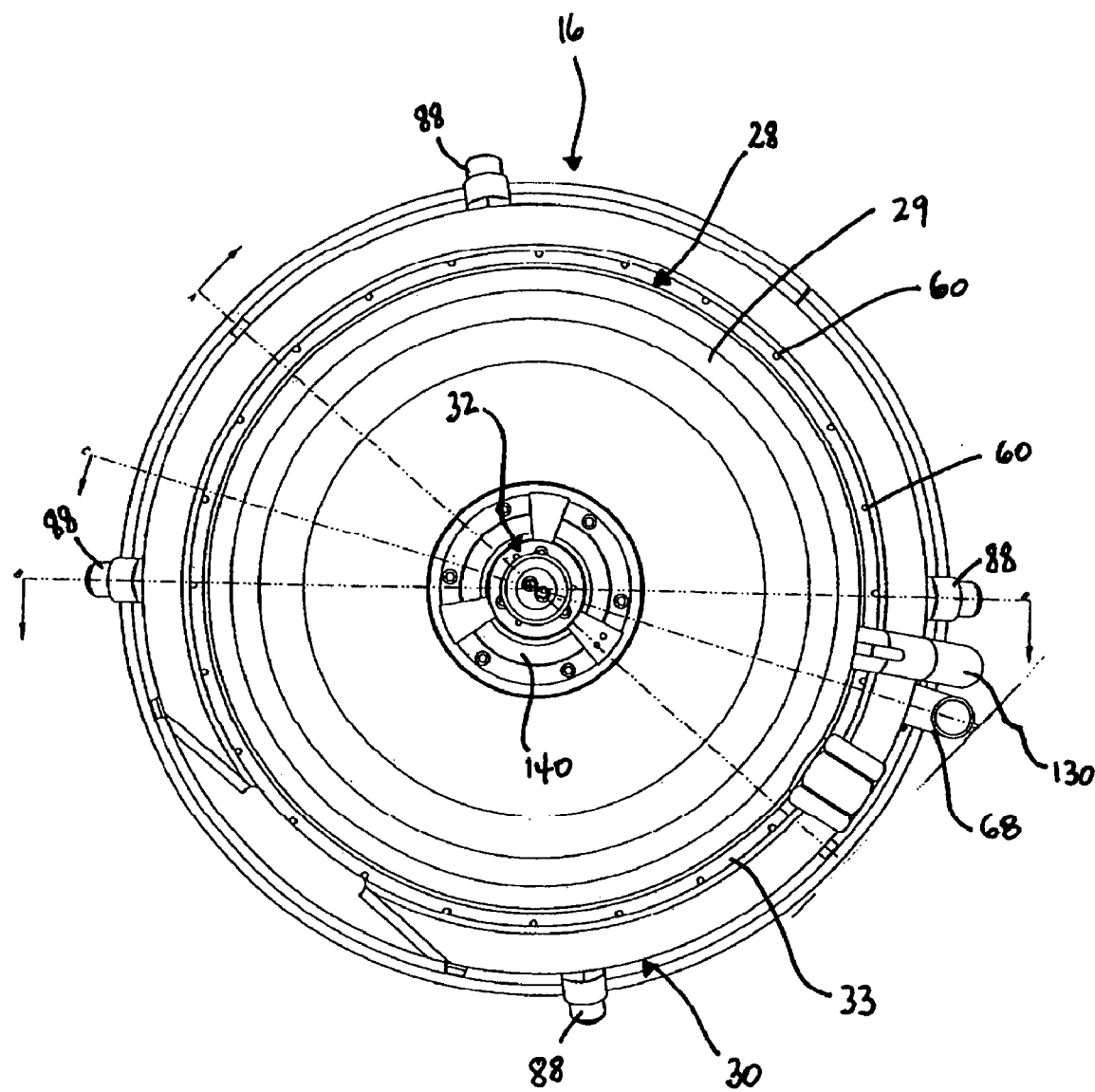
FIG. 4 is a top view of the workpiece process chamber shown in FIG. 3.

As shown in FIGS. 1–3, a processing system 10 has an enclosure 15, a control/display 17, and an input/output station 19 and a plurality of processing stations 14. Workpieces 24 are removed from carriers 21 at the input/output station 19 and processed within the system 10.

The processing system 10 includes a support structure for a plurality of processing stations 14 within the enclosure 15. At least one processing station 14 includes a workpiece processor 16 and an actuator 13 for opening and closing processor 16. The processor 16 of the present invention is designed to be utilized in a processing system 10, for example, as disclosed in pending U.S. Patent Application Ser. No. 60/476,786, filed Jun. 6, 2003, and U.S. Pat. Nos. 6,900,132 and 6,930,046.

These U.S. patents and application are incorporated herein by reference. System 10 may include only a plurality of processors 16 or it may include other processing modules, in addition to one or more processors 16, such as could be configured to perform a variety of functions including but not limited to electrochemical processing, etching, rinsing, and/or drying.

The system 10 in FIG. 2 is shown having ten process stations 14, but any desired number of processing stations 14 may be included in the enclosure 15. The processing station support preferably includes a centrally located, longitudinally oriented platform 18 between the processing stations 14. One or more robots 26 having one or more end-effectors 31 move within the enclosure 15 for delivering workpieces 24 to and from various processing stations 14, and to load and unload workpieces 24 into and out of the process stations 14. In a preferred embodiment, the robot 26 moves linearly along a track 23 in the space 18. A process fluid source and associated fluid supply conduits may be provided within enclosure 15 below the platform 18 in fluid communication with a workpiece processor 16 (shown in FIG. 3) and other processing stations 14.

FIGS. 3–11 illustrate a workpiece processor 16 according to the present invention. The processor 16 comprises a process head assembly 28 and a base assembly 30. The head assembly 28 is comprised of a process head 29, a head ring 33, an upper rotor 34, a fluid applicator 32 and a motor 38. The base assembly 30 is comprised of a mounting base 40, a lower rotor 36 and a bowl mount 43. The head assembly 28 can be moved vertically to engage with and separate from the base assembly 30. The head assembly 28 and the base assembly 30 form a process chamber 37 within which the upper 34 and lower 36 rotors are positioned.

Turning specifically to FIGS. 5–11, a process fluid applicator 32 extends upwardly from a central portion of the head assembly 28 and extends downwardly through a sleeve 96 into the head assembly. Air inlet 140 and process fluid inlets 92, 94 are positioned within the sleeve 96. The air inlet 140 and the process fluid applicator 32 run downwardly through central openings in the process head 29, the head ring 33 and the upper rotor 34. Process fluid supply lines (not shown) are connected to the upwardly extending portion of the process fluid applicator 32 for delivering process fluids into the workpiece process chamber. The motor 38 is positioned in the head 29 and is coupled to the upper rotor 34. During operation, the motor 38 spins the upper rotor 34. The head ring 33 mounts the upper rotor 34 and the motor 38 within the head 29. An automated actuator 13 is attached to the head assembly 28 and moves the process head assembly 28 from an open position, where a workpiece may be loaded into and removed from the process chamber 37 by robot 26, to a closed position where the workpiece will be processed. As will be explained more fully below, the head assembly 28 has a plurality of air inlets and passageways that contribute to the improved air flow management of the present invention.

The base assembly 30 lower rotor 36 has an engagement ring 110 with three tabs 114 which cooperate with a slotted mounting member 144 positioned at the bottom of the base 40 to attach the lower rotor 36 to the base 40. The tabs 114 of the engagement ring 110 cooperate with the slots of the mounting member 144 to create a bayonet connection. Positioned within the base 40 is at least a first annular magnet 42. The lower rotor 36 also includes at least one second magnet 44. It should be understood, that instead of using single annular magnets in the base 40 and lower rotor 36 a plurality of non-annular magnets may also be used. The first 42 and second 44 magnets are adjacent to one another and have a like polarity. By utilizing magnets having a like magnetic field or polarity, the first 42 and second 44 magnets repel one another, causing the lower rotor 36 to be forced upwards from the base 40 by a magnetic force. When the head and base assemblies 28 and 30 are separated, the magnetic force of the magnets 42, 44 pushes the lower rotor 36 away from base 40 causing the tabs 114 of the engagement ring 110 to firmly engage the mounting member 144 of the base, thus providing the desired bayonet connection.

Figure 6:
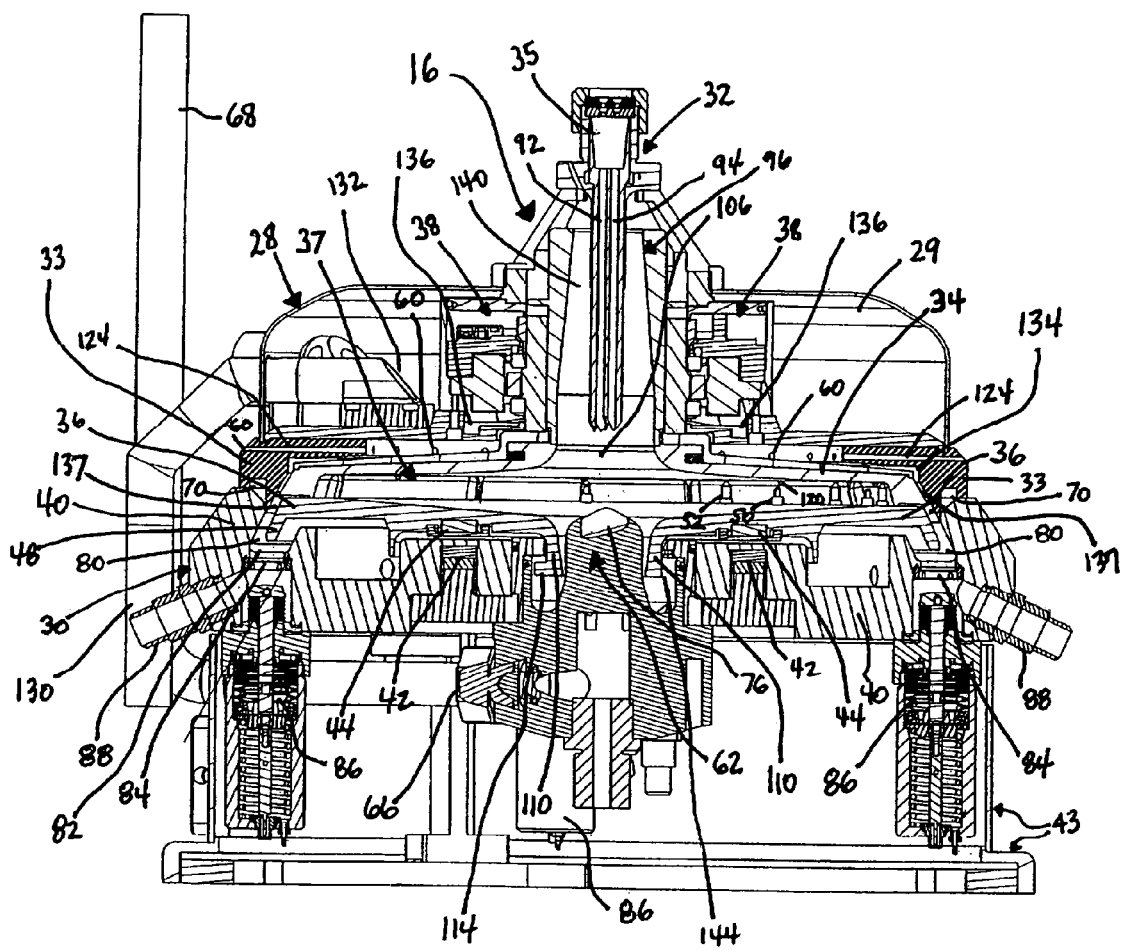
FIG. 6 is a cross-sectional view of the workpiece processor shown in FIG. 4 taken along dashed line B—B.
Figure 7:
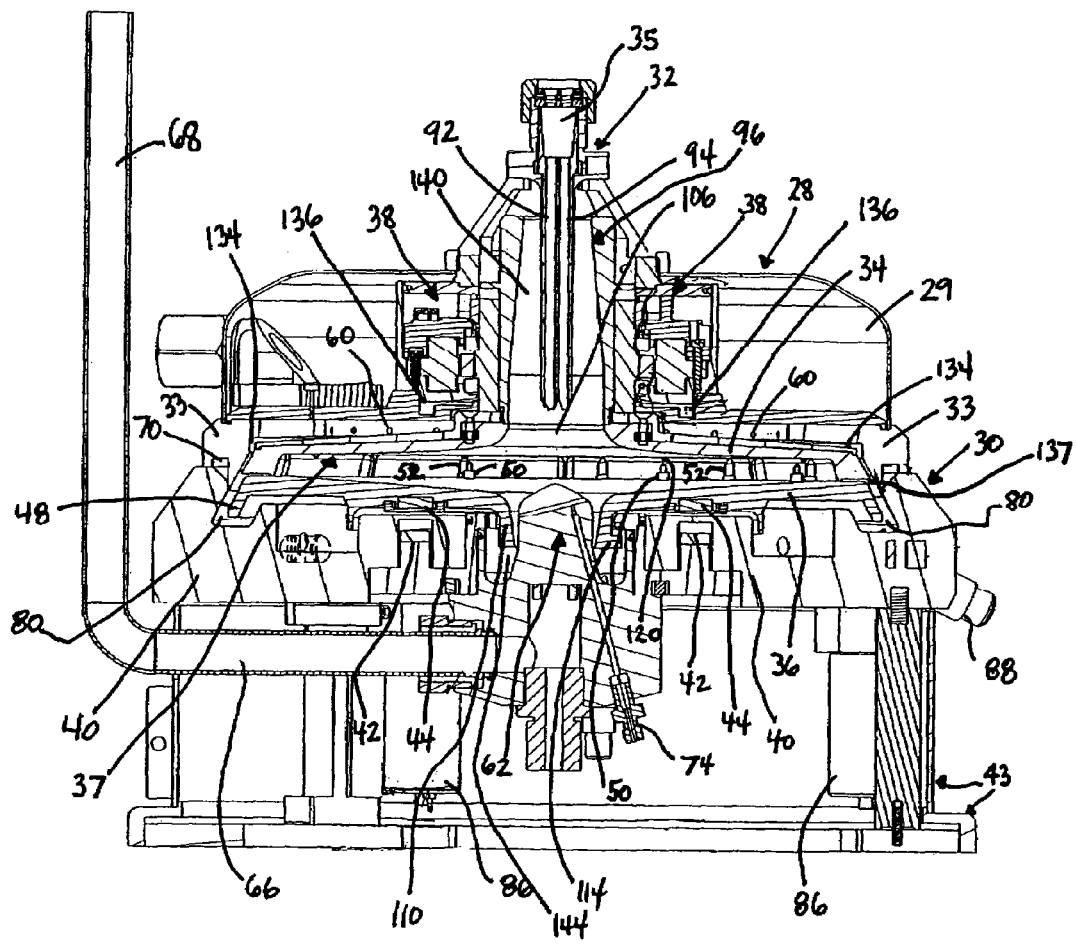
FIG. 7 is a cross-sectional view of the workpiece processor shown in FIG. 4 taken along dashed line C—C.
Figure 7A:
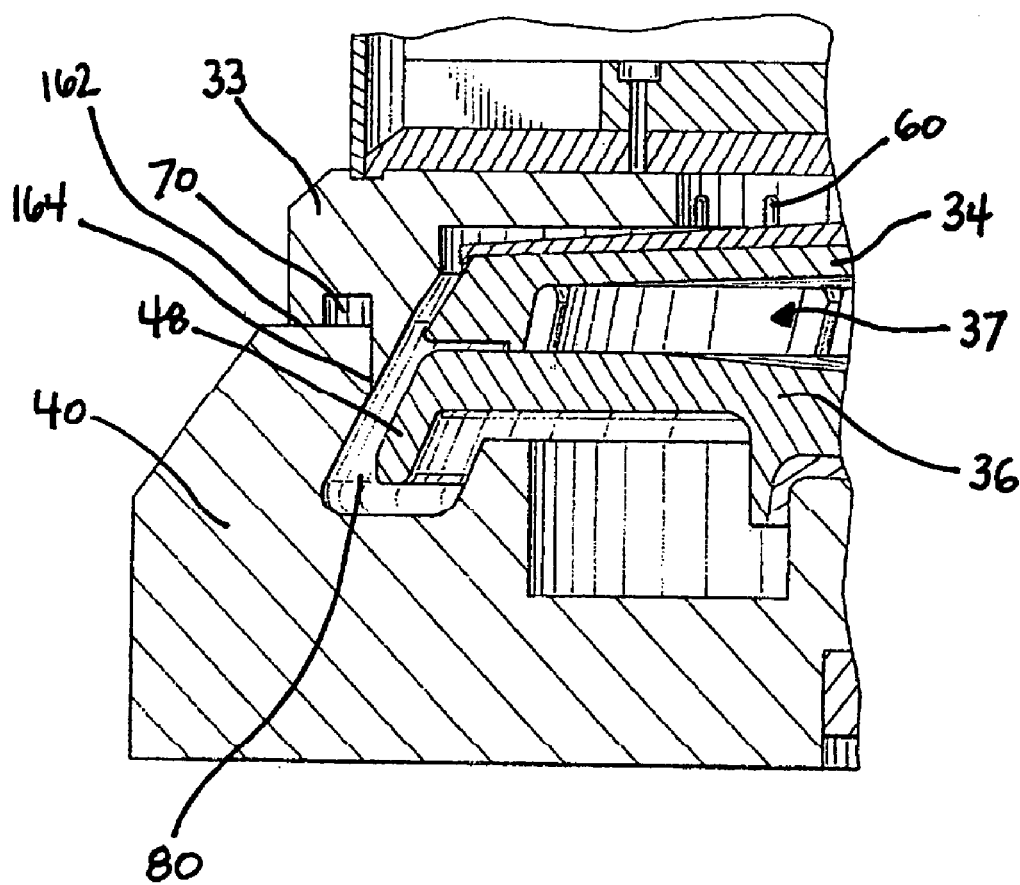
FIG. 7A is an enlarged partial view of the area of the processor designated A in FIG. 7.
Figure 8:
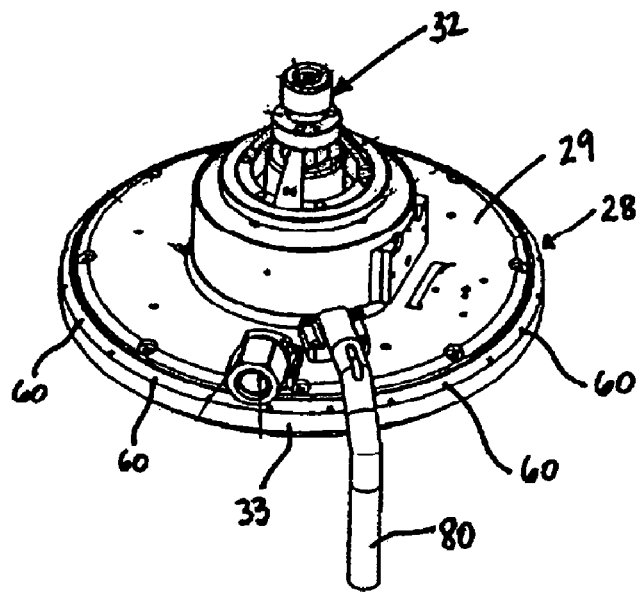
FIG. 8 is a perspective view of a process head assembly according to the present invention.
Figure 9:
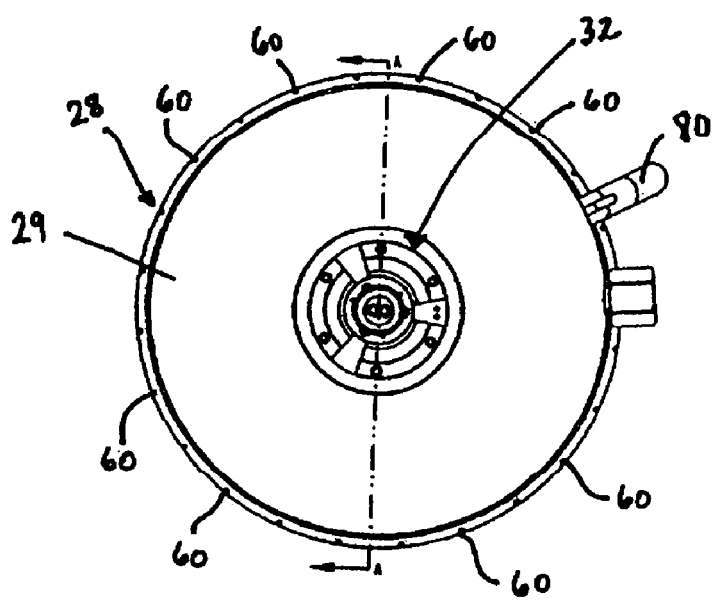
FIG. 9 is a top view of the process head assembly shown in FIG. 8
Figure 10:
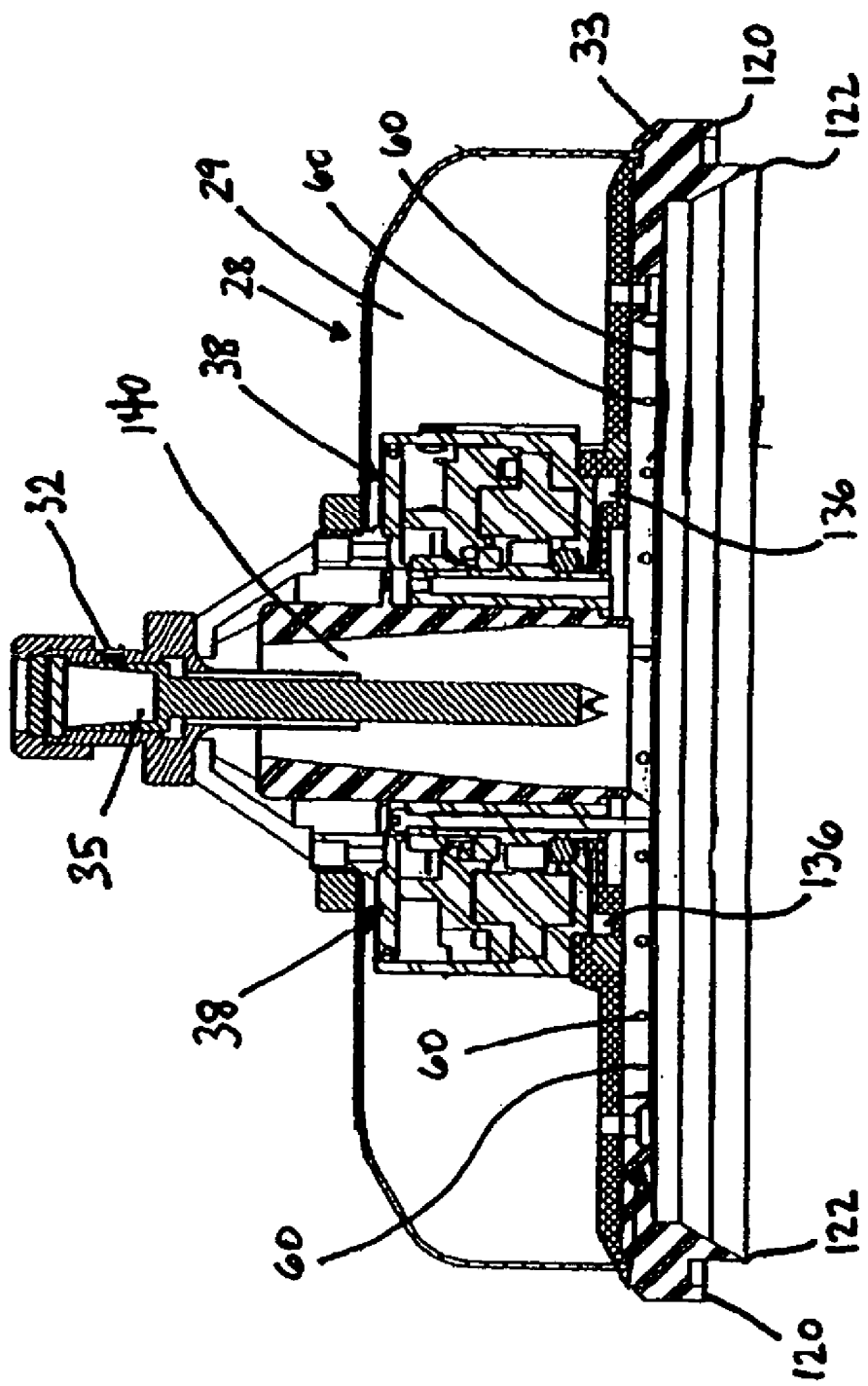
FIG. 10 is a cross-sectional view of the process head assembly shown in FIG. 9 taken along dashed line A—A.
Figure 11:
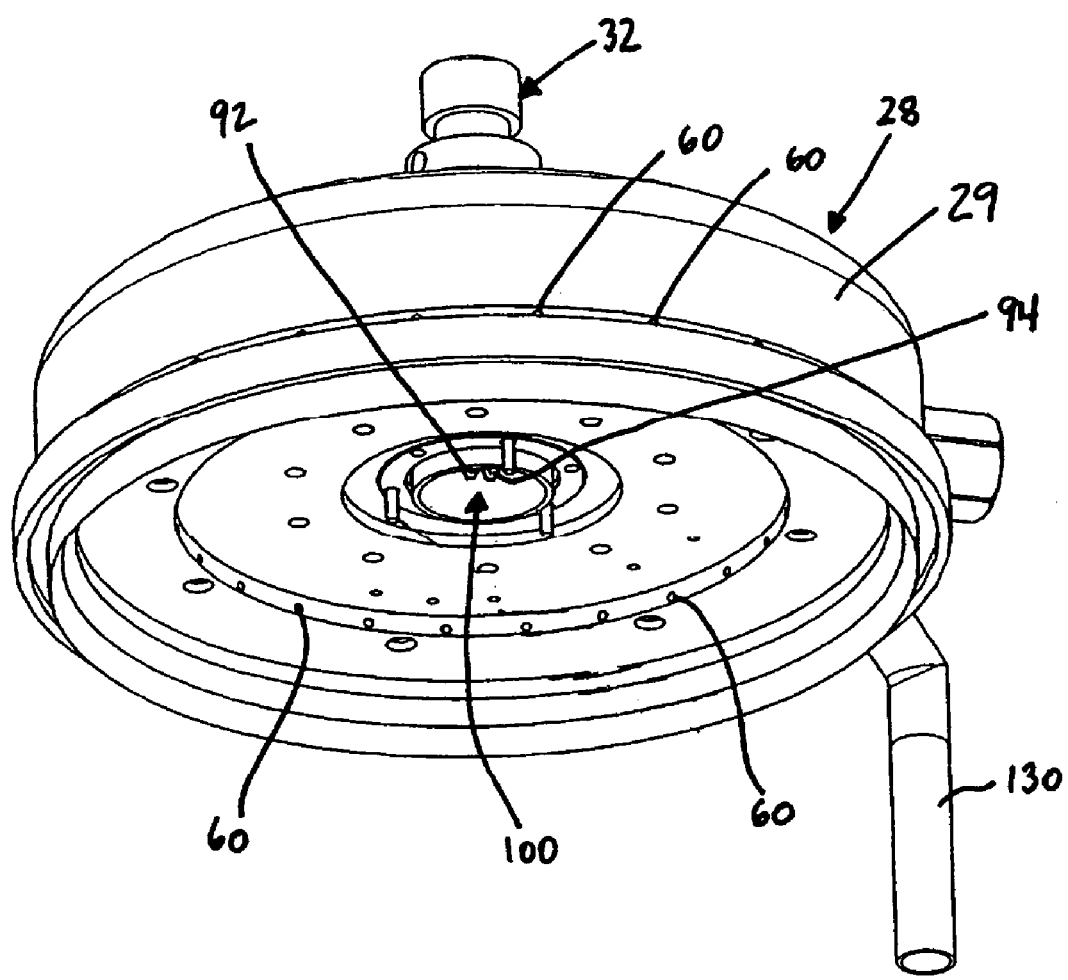
FIG. 11 is a perspective view of a bottom portion of a process head assembly according to the present invention.

When the head and base assemblies are to be engaged, the actuator 13 lowers the head assembly 28 until the upper rotor 34 contacts the lower rotor 36. Upon further force from the actuator 13, the upper rotor 34 pushes down on the lower rotor 36 and against the repulsion force created by the magnets 42, 44 until the head ring 33 seats on the base as shown in FIG. 7A at 33A. When the head ring 33 seats on the base, the contact between the tabs 114 of the engagement ring 110 and the mounting member 144 is broken, and the lower rotor 36 is free to spin with the upper rotor 34. With the head ring 33 and base 40 in the positions shown in FIGS. 5–7A, with the lower rotor free to spin with the upper rotor, the repulsion force created by the magnets 42,44 maintains the contact between the upper and lower rotors until the head assembly is raised for loading/unloading the processor.

Turning to FIGS. 5–7 and 12–16, the base 40 includes an annular plenum 80 which has several (e.g., four) drains 82. The drains 82 are pneumatically actuated via a poppet valve 84 and actuator 86. Each drain 82 is provided with a fitting connector 88 to provide separate paths for conducting processing liquids of different types to appropriate systems (not shown) for storage, disposal, or recirculation. Accordingly, cross contamination of process fluids is minimized. As best shown in FIGS. 5–7, 18A–C and 20A–C, the lower rotor 36 has a skirt 48, which extends downwardly into annular plenum 80 and encourages process fluids to flow into annular plenum 80 and through the drains 82.

Still referring to FIGS. 5–7, 18A–C and 20A–C, the lower rotor 36 has a plurality of pins extending upwardly from its surface. First, the lower rotor 36 includes a plurality of stand-off pins 50. When the workpiece 24 is loaded into the process chamber 37, the workpiece 24 initially sits on the stand-off pins 50. The lower rotor 36 also includes a plurality of alignment pins 52, which align and center the workpiece 24 in the x-y plane when the workpiece 24 is loaded into the process chamber 37. The alignment pins 52 extend farther away from the surface 150 of the lower rotor 36 than the stand-off pins 50 do, preventing the workpiece 24 from being misaligned in the process chamber 16. Finally, the lower rotor 36 includes at least one, and preferably a plurality of engagement pins 54. The engagement pins 54 preferably having a beveled end to enhance coupling with the upper rotor 34 (as explained below) and an annular gasket or O-ring 56 formed from a compressible material to create a flexible contact with the upper rotor 34.

Turning to FIGS. 5–7, 17A–C and 19A–C, the upper rotor 34 includes a plurality of stand-off pins 120 and countersunk bores 46. During operation, and best shown in FIGS. 5–7, the workpiece 24 (not shown) is contained between the stand-off pins 120 of the upper rotor 34 and the stand-off pins 50 of the lower rotor 36. Workpiece process chamber 37 is formed between the inner surface 148 of the upper rotor 34 and an inner surface 150 of the lower rotor 36. The stand-off pins 50, 120 do not clamp the workpiece 24 between them, but instead contain the workpiece within a desired clearance, allowing the workpiece 24 to slightly "clock," i.e., float within the desired clearance, during processing. This prevents the workpiece 24 from being pinched and accidentally damaged and allows a greater surface area of the workpiece 24 to be treated. In a preferred embodiment, there is a 0.02 inch clearance between stand-off pins 50, 120, which permits the workpiece 24 to be "clocked" during processing. This arrangement allows substantially the entire surface of the workpiece 24 to be treated, even the surface area which would otherwise be covered by the stand-off pins 50, 120.

Figure 5:
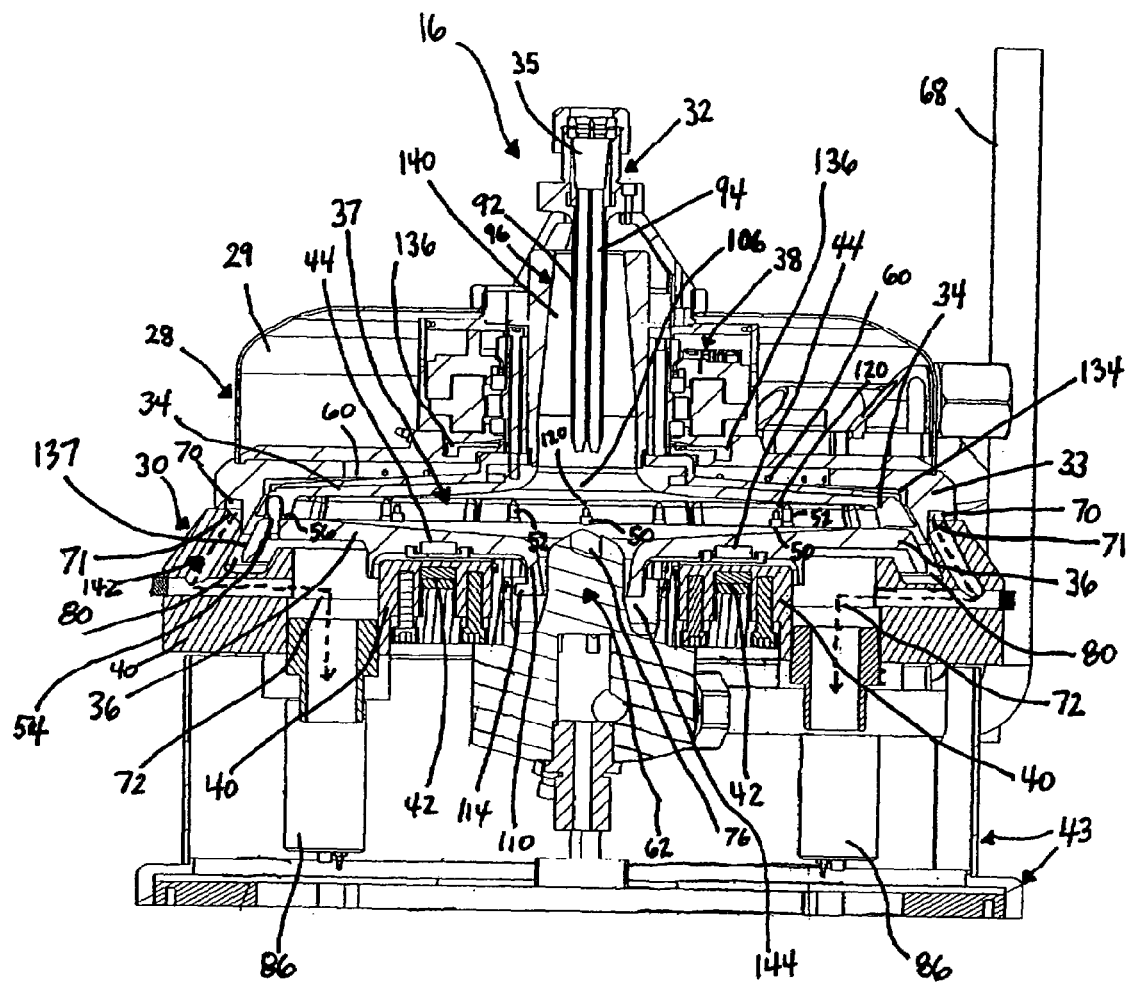
FIG. 5 is a cross-sectional view of the workpiece processor shown in FIG. 4 taken along dashed line A—A.

Referring specifically to FIG. 5, as the upper rotor 34 engages the lower rotor 36, the beveled end of the engagement pins 54 are inserted into a corresponding one of the plurality of bores 46 (shown in FIG. 17C) in the upper rotor 34. The annular, compressible gasket or O-ring 56 enhances contact between the upper rotor 34 and the lower rotor 36 and acts as a vibration dampener when the process chamber 16 is in use.

Figure 17A:
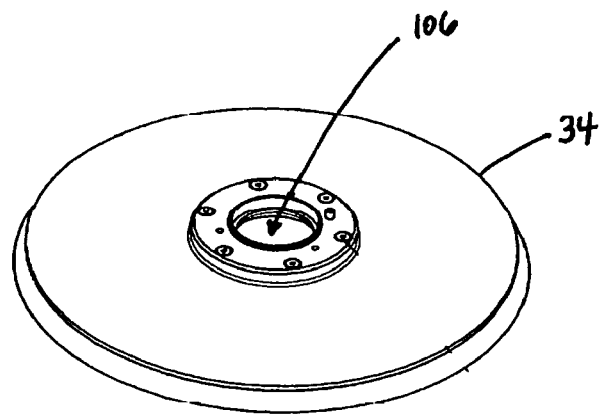
FIG. 17A is a top perspective view of an upper rotor according to one embodiment of the present invention.
Figure 17B:
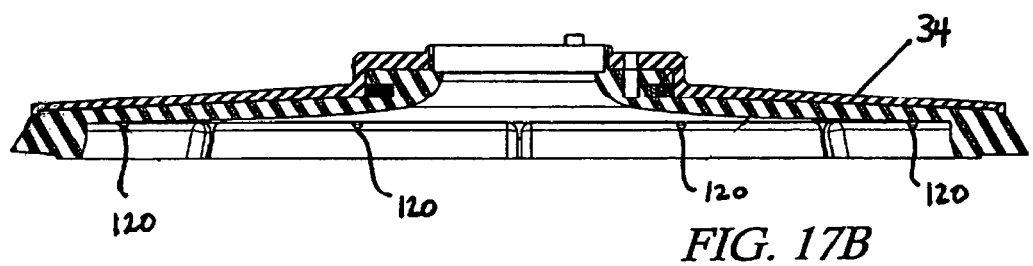
FIG. 17B is a cross-sectional view of the upper rotor illustrated in FIG. 17A.
Figure 17C:
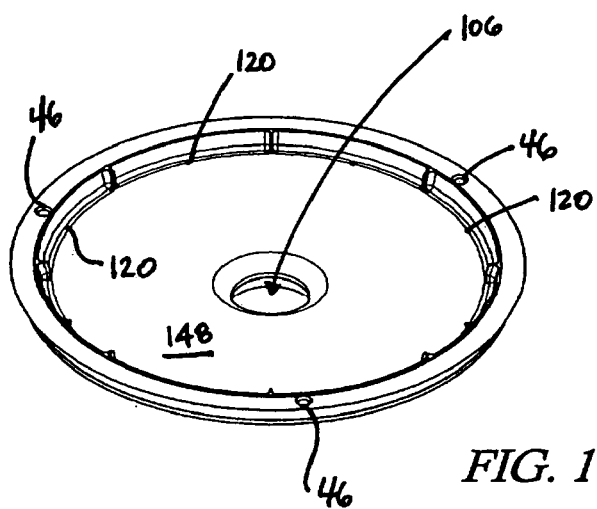
FIG. 17C is a bottom perspective view of the upper rotor illustrated in FIGS. 17A and 17B.
Figure 18A:
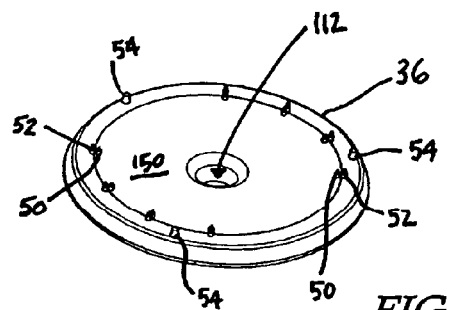
FIG. 18A is a top perspective view of a lower rotor according to one embodiment of the present invention.
Figure 18B:
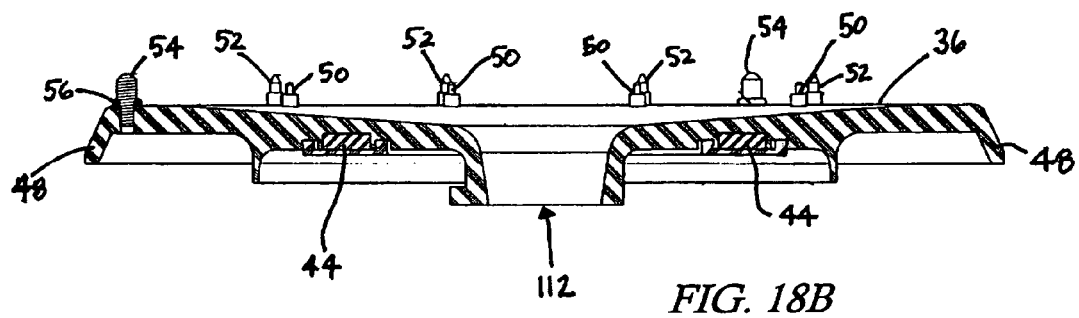
FIG. 18B is a cross-sectional view of the lower rotor illustrated in FIG. 18A.
Figure 18C:
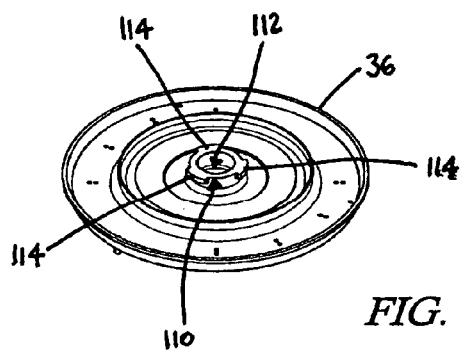
FIG. 18C is a bottom perspective view of the lower rotor illustrated in FIGS. 18A and 18B.

While the general configuration of the upper 34 and lower 36 rotors is as described above, the specific configuration may vary depending on the desired process to be carried out in the process chamber 16. For example, FIGS. 17A–C and 18A–C show the upper 34 and lower 36 rotors utilized in a process for removing polymer or a masking material from a wafer surface. In this preferred embodiment, the rotor configurations conform to the general description provided above. As shown in FIGS. 17A–C, however, the upper rotor 34 is segmented or provided with notches 160 to allow process fluids to more freely exit the process chamber 37.

However, it may be preferred to employ slight variations to the rotor configurations described above for a different process. For example, the rotor configurations for a process commonly known as "backside bevel etch" are disclosed in FIGS. 19A–C and 20A–C. Generally, in a "backside bevel etch" process, a chemical solution (e.g., hydrofluoric acid) is provided to etch, or selectively remove, metal or oxide layers from the backside and/or peripheral edge, i.e., the bevel edge, of the wafer. During this process, while the backside and bevel are being supplied with the chemical solution, the top side of the wafer is being supplied with an inert gas or deionized water rinse, or an alternate processing solution. After etching, the etched side and preferably both sides of the wafer are supplied with deionized water rinse, spun to remove fluids, and dried with heated nitrogen. A detailed explanation of semiconductor etching processes, including the "backside bevel etch" process is disclosed in U.S. Pat. No. 6,632,292, assigned to the assignee of the present invention, and incorporated herein by reference.

Figure 19A:
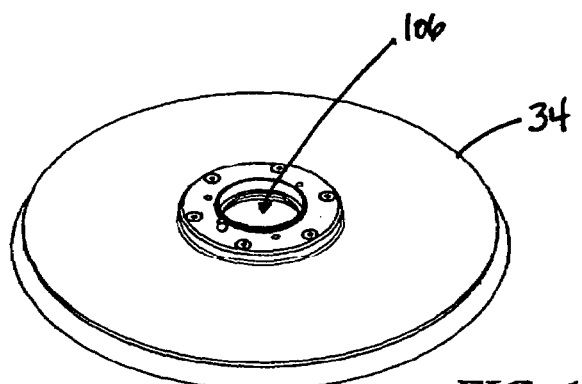
FIG. 19A is a top perspective view of an upper rotor according to another embodiment of the present invention.
Figure 19B:
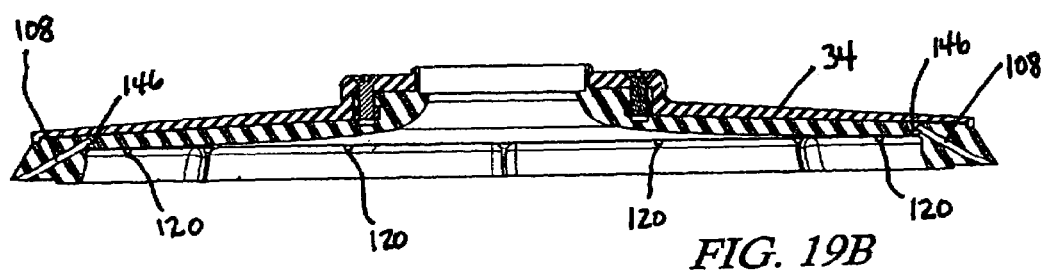
FIG. 19B is a cross-sectional view of the upper rotor illustrated in FIG. 19A.
Figure 19C:
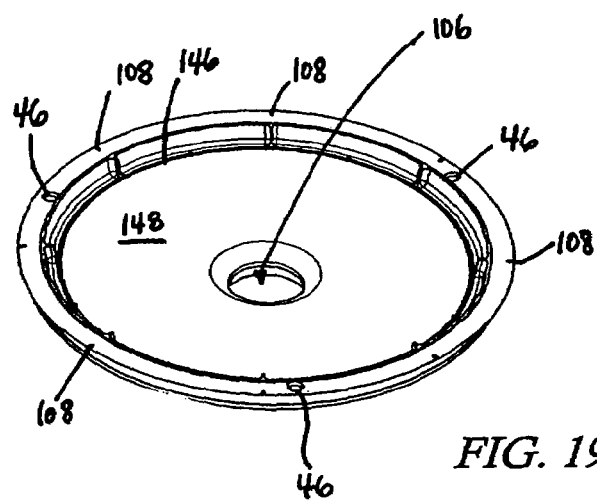
FIG. 19C is a bottom perspective view of the upper rotor illustrated in FIGS. 19A and 19B.
Figure 20A:
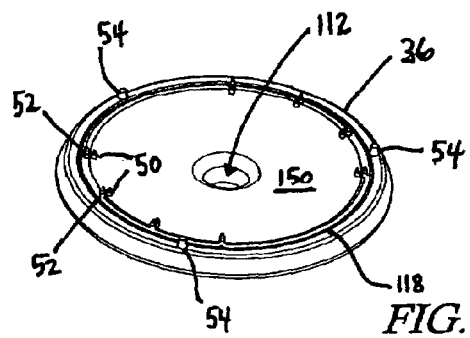
FIG. 20A is a top perspective view of a lower rotor according to another embodiment of the present invention.
Figure 20B:
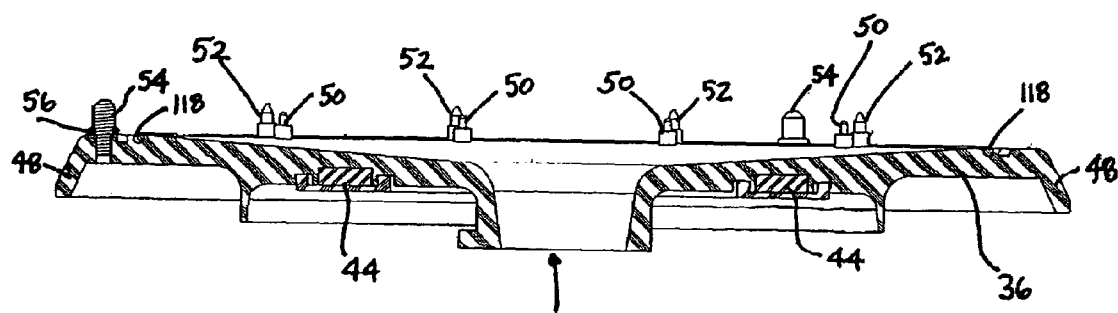
FIG. 20B is a cross-sectional view of the lower rotor illustrated in FIG. 20A.
Figure 20C:
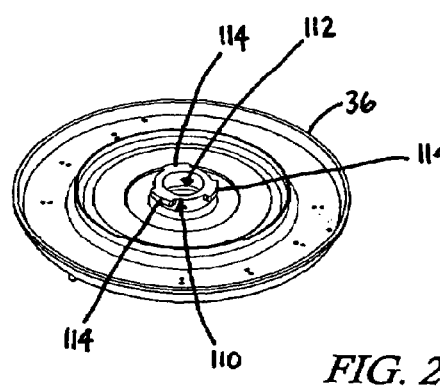
FIG. 20C is a bottom perspective view of the lower rotor illustrated in FIGS. 20A and 20B.

In a preferred embodiment, the upper rotor 34 utilized for a "backside bevel etch" process is disclosed in FIGS. 19A–C. The upper rotor 34 includes a process fluid passageway 108 that communicates with an annulus 146 formed in the inner surface 148 of the upper rotor 34. Turning to FIGS. 20A–C, the lower rotor 36 preferred for use in the "backside bevel etch" process includes a sealing member 118 that runs circumferentially around the outer perimeter of the lower rotor 36. Preferably, the sealing member 118 is formed from a compressible material. When the upper 34 and lower 36 rotors are engaged, the sealing member 118 deforms and creates a contact face seal between the rotors. The contact face seal is not a complete seal. That is, even with the contact face seal, "leaks" are provided to allow draining of the process chamber 37. The magnetic force from magnets 42, 44 keep the lower rotor 36 and upper rotor 34 engaged and the contact seal in place during processing. During the "backside bevel etch" process, the acidic process fluid applied to the backside of the wafer wraps around the periphery or bevel edge of the wafer onto a portion of the top side of the wafer. As a result, the acidic process fluid is forced into the annulus 146 formed in the inner surface 148 of the upper rotor 34 by the inert gas being applied to the top side of the wafer, and is vented out through the process fluid passageway 108 in the upper rotor 34.

Figure 21A:
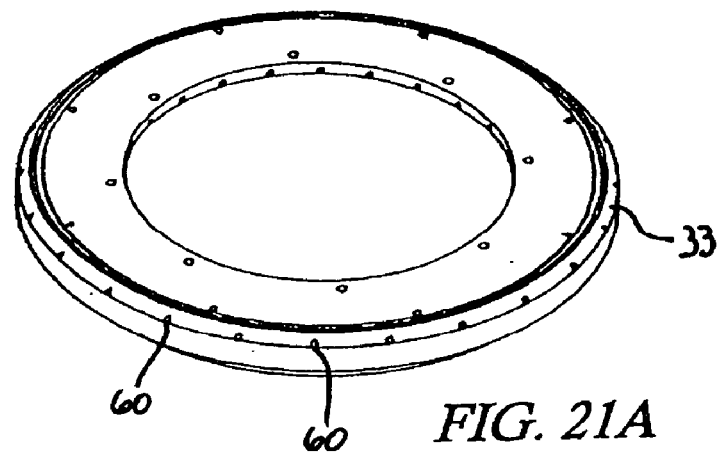
FIG. 21A is a top perspective view of a head ring of a process head assembly according to the present invention.
Figure 21B:
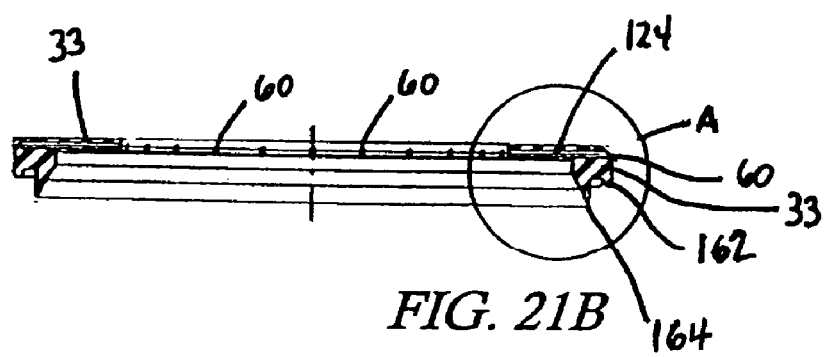
FIG. 21B is a cross-sectional view of the head ring illustrated in FIG. 21A.
Figure 21C:
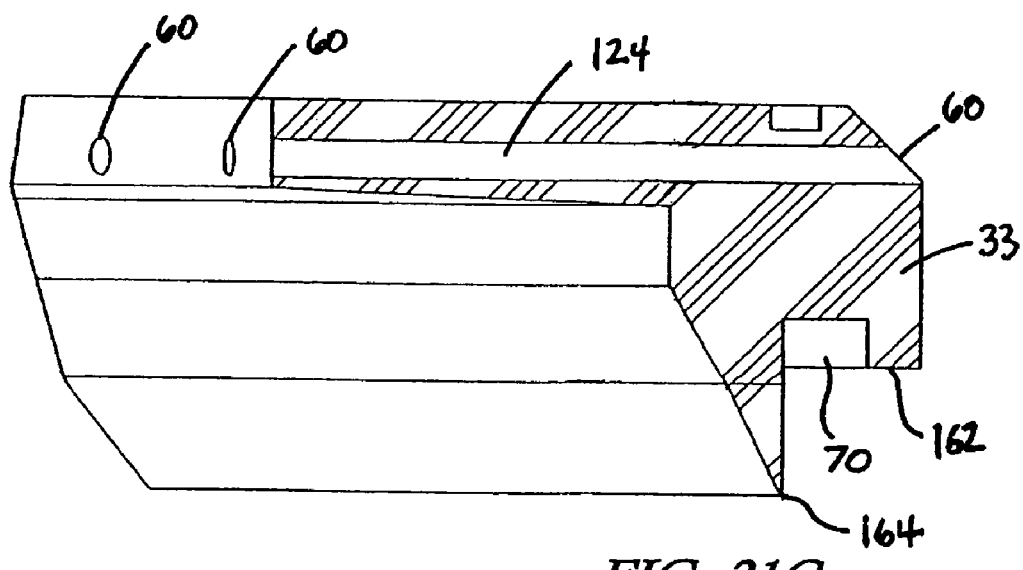
FIG. 21C is an enlarged partial view of the area of the head ring designated A in FIG. 21B.

Turning to FIGS. 21A–C, and as shown in FIG. 7A, the head ring 33 includes a rim 162 and a vertical cylindrical alignment surface 164. When the head assembly 28 and base assembly 30 are closed, the vertical cylindrical alignment surface 164 aligns the head ring 33 with the base 40 and rim 162 rests on the rim of the base 40 to ensure proper alignment between the upper 34 and lower 36 rotors.

The improved air flow and process fluid drainage aspects of the new wafer processing system will now be discussed.

First, the head assembly 28 has a multitude of air flow passageways which draw ambient air from the fab environment into the head assembly 28 and out through the base 40 of the process chamber 16. As shown in FIG. 6, an annulus 136 is positioned in the head 29 just below the motor 38. The annulus 136 is connected to an air aspirator (not shown), which sucks gaseous vapors or particles from the motor 38 out of the head 29. An aspirator tube (not shown) exits the head 29 via a service conduit attached to support 130. The negative pressure created by the aspirator 132 also acts to remove any gaseous vapors or fumes that may come from other air passageways in the head assembly 28 or the base 40.

Second, turning to FIGS. 5–7 and 21A–C, a plurality of vents holes 60 are formed in the head ring 33. As specifically shown in FIGS. 21A–C, the vent holes 60 draw air from the mini-environment within enclosure 15 through air channels 124 into an inner volume or air gap 134 formed by the slanting outer surface of the upper rotor 34 and the head ring 33. The inner air gap 134 communicates with a channel 137 that wraps around the periphery of both the upper rotor 34 and the lower rotor 36, and continues down into the annular drain cavity 80 formed in the recess of the base 40. Eventually, process fluid vapors are vented out through the exhaust ports 82 formed in the annular drain cavity 80.

Figure 12:
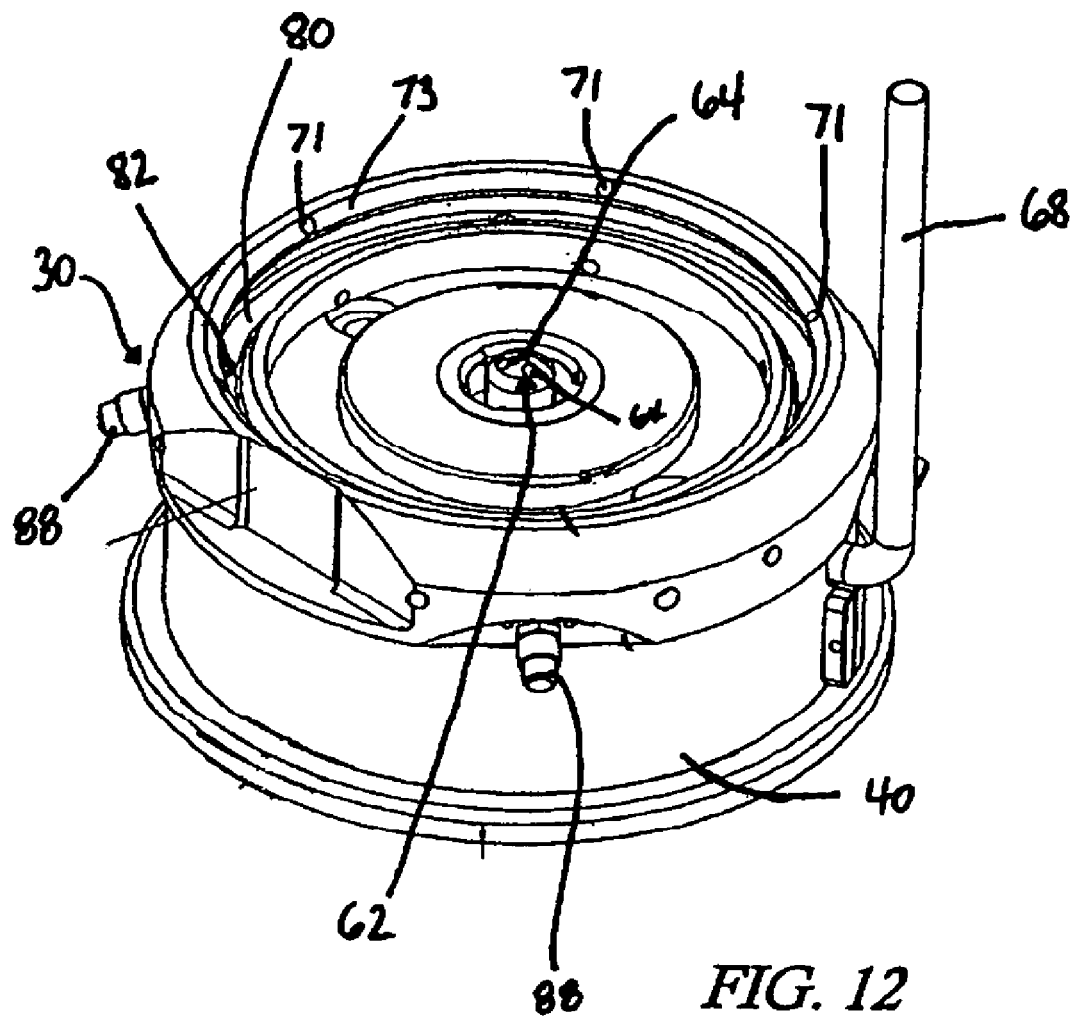
FIG. 12 is a perspective view of a top portion of a base assembly according to the present invention.
Figure 13:
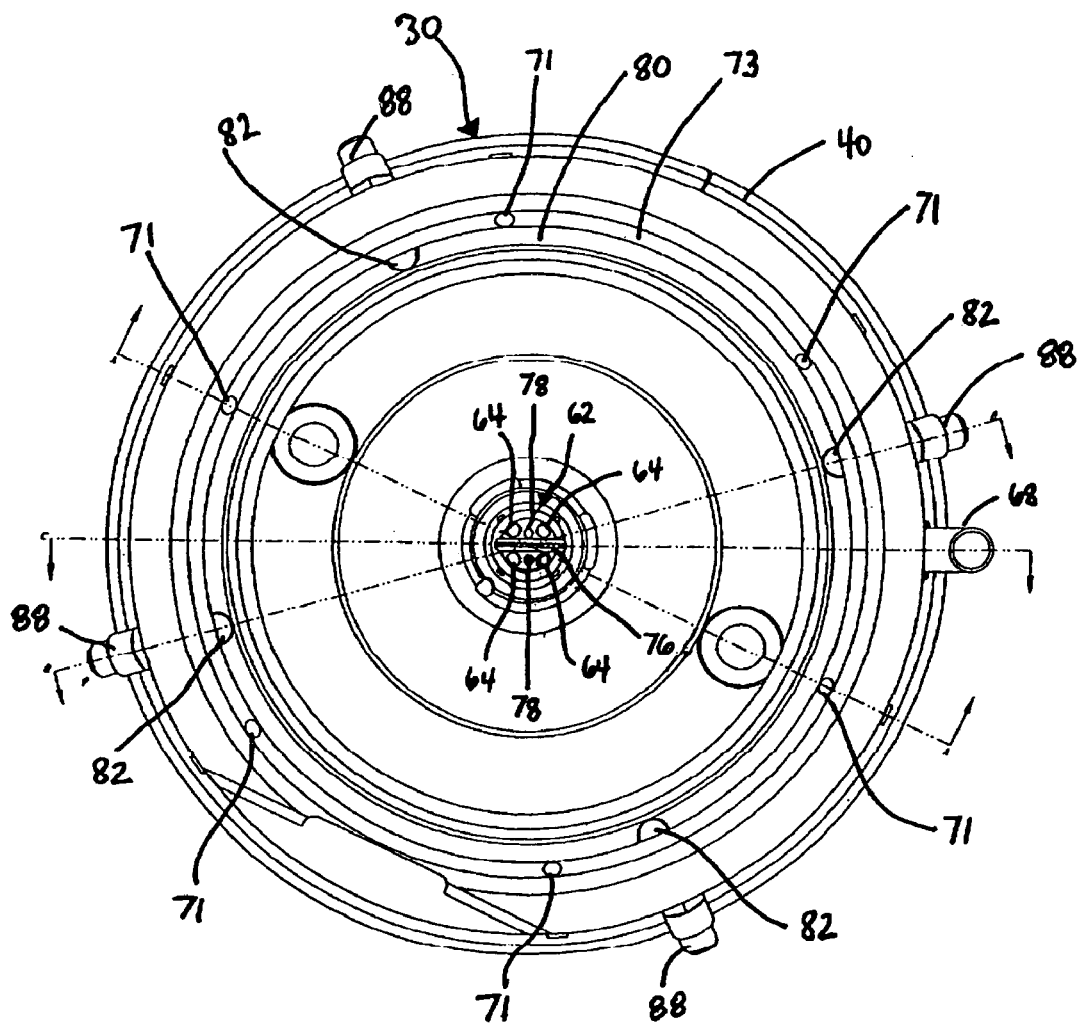
FIG. 13 is a top view of the base assembly shown in FIG. 12.
Figure 14:
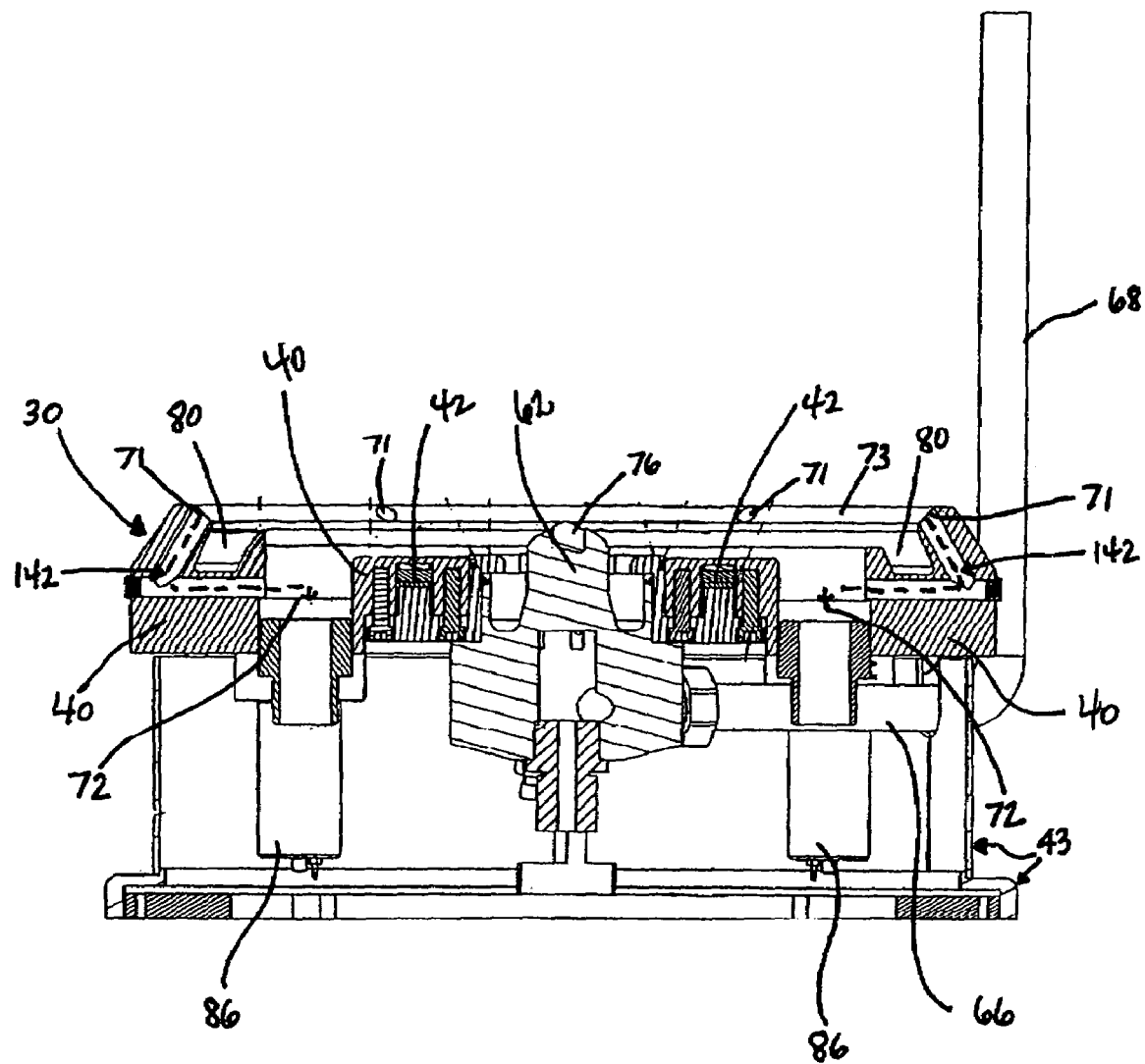
FIG. 14 is a cross-sectional view of the base assembly shown in FIG. 13 taken along dashed line A—A.
Figure 15:
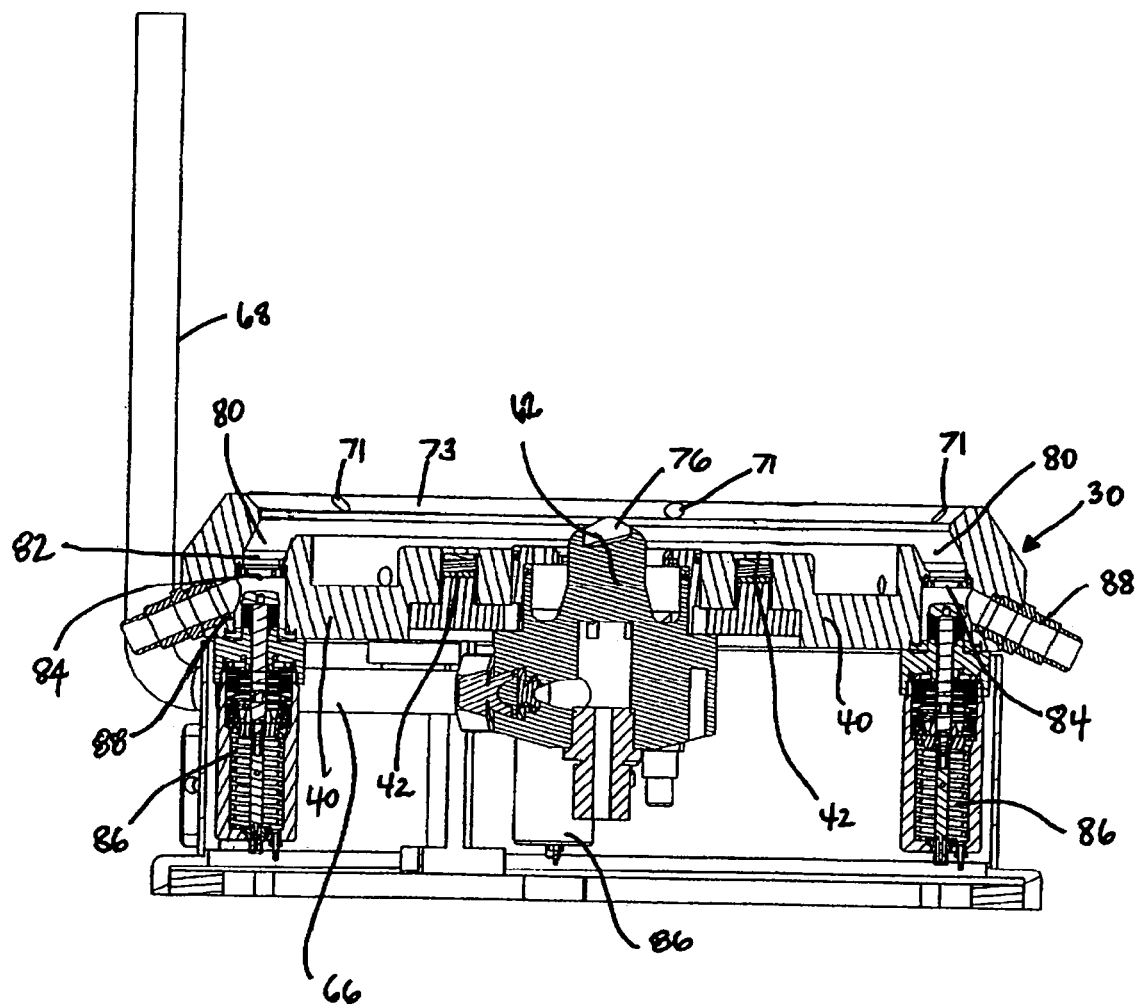
FIG. 15 is a cross-sectional view of the base assembly shown in FIG. 13 taken along dashed line B—B.
Figure 16:
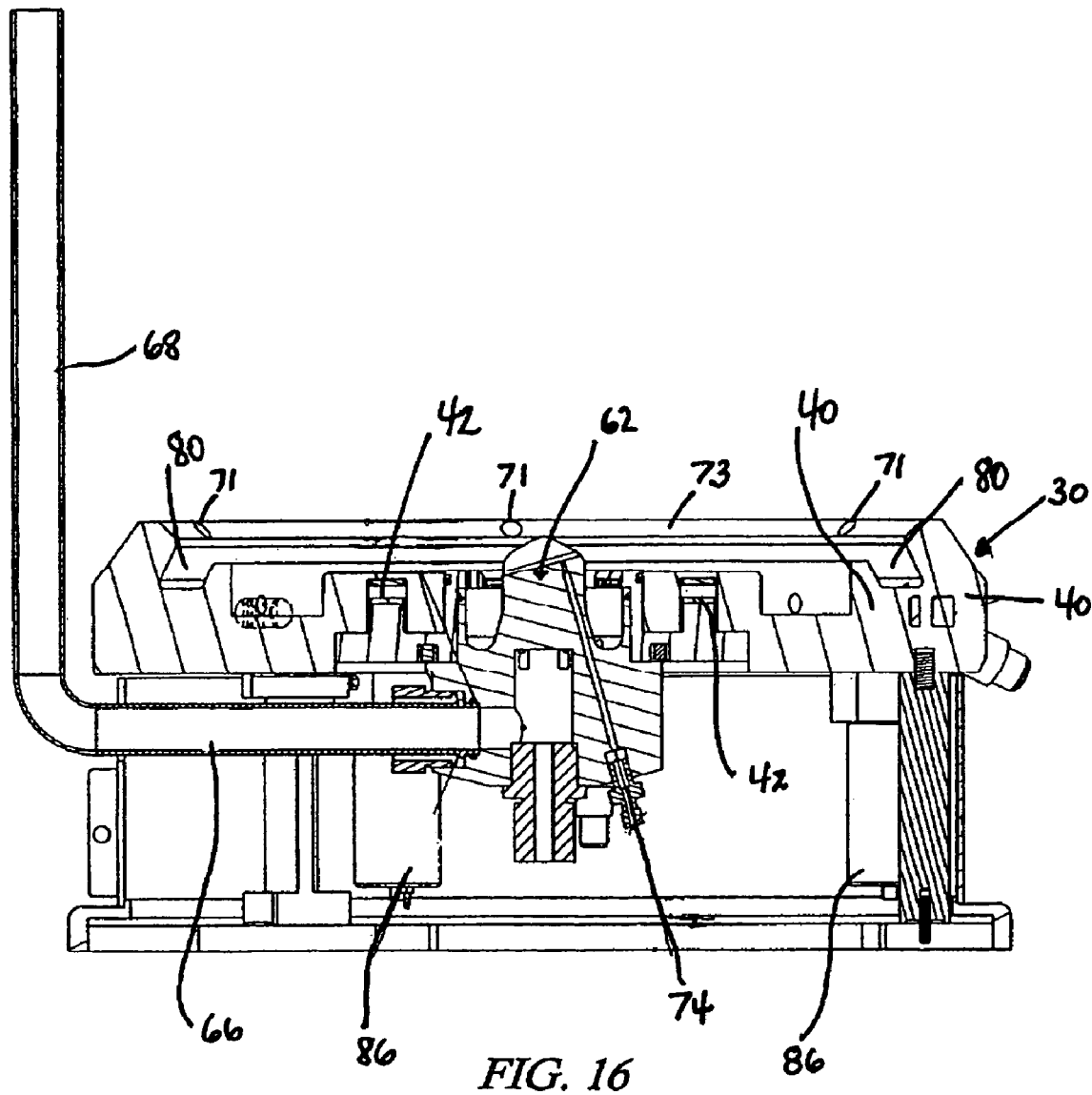
FIG. 16 is a cross-sectional view of the base assembly shown in FIG. 13 taken along dashed line C—C.

Third, the process chamber 16 of the present invention is also designed to relieve inherent pressure build up experienced by carrying out operations in a closed process chamber 16. Referring to FIGS. 12–14, a plurality of openings 71 are formed in the upper rim 73 of the base 40. The openings 71 are connected to exhaust channels 142 formed in a lower portion of base 40. A pump or the like (not shown) is connected to the exhaust channels 142 via at least one, and preferably two, exhaust ports 72, creating a negative pressure and a path for exhausting process fluids through the channels 142 (represented by the dashed lines in FIG. 14). Turning now to FIG. 5, when the head assembly 28 is lowered and engages the base 40, an annular plenum 70 formed in the head ring 33 covers the upper rim 73 of the base 40. The annular plenum 70 in the head ring 33 permits the openings 71 in the upper rim 73 to receive "blow-by" of process fluids during operation. These "blow-by" process fluids are bled off by the negative pressure in the exhaust channels 142. Again, this process path is represented by dashed lines in FIG. 5. Accordingly, unwanted pressure build up in the process chamber 37 is minimized during operation.

Fourth, air is introduced directly into the workpiece process chamber through openings in the head assembly 28 and the base assembly 30. Turning to FIGS. 12–16, the base assembly 30 includes a centrally positioned process fluid applicator 62 that extends upwardly from the base 40. Generally, the processing fluids may be a liquid, vapor or gas or a combination of liquid/vapor/gas. The process fluid applicator 62 in the base assembly 30 includes a back-side vent aperture 64. In a preferred embodiment, process fluid applicator 62 includes a plurality of back-side vent apertures 64. The back-side vent apertures 64 communicate via air channel 66 with snorkel 68. The snorkel 68 is open to the mini-environment inside the enclosure 15, allowing air to be delivered directly to the backside of the workpiece. Turning to the head assembly 28 and FIGS. 3–7, an air inlet 140 is formed in a central portion of the assembly 28. One end of the air inlet 140 is open to the mini-environment and one end opens into the workpiece process chamber through opening 106 in the upper rotor 34. Accordingly, air is drawn from the mini-environment into the workpiece process chamber to provide air directly to the top and backsides of the workpiece.

During operation, process fluids are applied to the top and backsides of the workpiece. The process fluid applicators of the present invention will now be discussed in more detail. Both the head assembly 28 and the base assembly 30 include process fluid applicators. Referring to FIG. 13, the base assembly 30 has a process fluid applicator 62 in the base 40. The applicator 62 includes a connector 74 for connecting the process fluid applicator to a various process fluid supplies. Accordingly, the applicator 62 includes additional ports; e.g., lateral slotted port 76 and apertures 78. The ports and apertures in the process fluid applicator 62 direct process fluid upward through opening 112 in the lower rotor 36 towards the backside workpiece surface. For example, in a preferred embodiment, air is supplied through vent apertures 64, an etchant (e.g., hydrofluoric acid, sulfuric acid, or a mixed acid/oxidizer) is supplied through lateral slotted port 76, deionized water is supplied through a first aperture 78 and nitrogen and isopropylalcohol are supplied through second aperture 78. The applicator 62 may also include a purging nozzle for directing a stream of purging gas, such as nitrogen across the workpiece surface.

With reference now to FIGS. 5–11, and as mentioned above, the head assembly 28 also includes a process fluid applicator 32. The applicator 32 has a nozzle 35 for directing streams of processing fluids through inlets 92, 94 and out into the workpiece process chamber through openings 100 in the head 29 and 106 in the upper rotor 34, respectively. The processing fluids provided through nozzle 35 and inlets 92, 94 may be the same or different fluids. Examples of such processing fluids include air nitrogen, isopropylalcohol, deionized water, hydrogen peroxide, ST-250 (a post-ash residue remover solution), an etchant (e.g., hydrofluoric acid, sulfuric acid), or any combination thereof. The nozzle 35 and inlets 92, 94 extend axially downwardly through a sleeve 96 (that includes air inlet 140) in the head 29 so as not to interfere with rotation of the upper rotor 34, which is coupled to motor 38.

Operation of the new wafer processing system will now be explained. With the process head assembly in an open position, robot 26 loads a workpiece 24 into the process chamber 37 where it sits on stand-off pins 50 extending from the lower rotor 36. Actuator 13 begins to lower the head assembly 28 until it engages base assembly 30. Axial centering extension 122 of the head ring 33 contacts the chamber assembly first, ensuring that head assembly 28 and the base assembly 30 are axially aligned. The head assembly 28 continues to move downward, until the upper rotor 34 makes contact with the lower rotor 36. Eventually, the force applied to the lower rotor 36 (from the actuator 13 via upper rotor 34) will overcome the magnetic repulsion force between the magnets 42 in the base bowl 40 and the magnets 44 in the lower rotor 36, relieving engagement ring 110 (of the lower rotor 36) from the slotted mounting member 144 (of the base 40). Engagement pins 54 of the lower rotor 36 are inserted into the corresponding bores 46 in the upper rotor 34. It may be necessary to rotate the rotors 34, 36 slightly in order to align the engagement pins 54 with the bores 46.

At this point in the operation of processor 16, the process chamber 37 is in a fully-closed, process position. In this position, the device or top side of the workpiece 24 and the inner surface 148 of upper rotor 34 form a first process chamber 102. The bottom side or backside of the workpiece 24 and the inner surface 150 of lower rotor 46 form a second process chamber 104. As discussed above, fluid applicator 32 introduces process fluid to the first process chamber 102, while fluid applicator 62 introduces process fluid to the second process chamber 104. In a preferred embodiment, the motor 38 rotates one of either the upper rotor 34 or the lower rotor 36. Because the rotors 34, 36 are engaged, the workpiece 24 is spun while process fluids are applied to the top and backsides of the workpiece 24. Liquids flow outwardly over the workpiece 24 via centrifugal force. This coats the workpiece 24 with a relatively thin liquid layer. The tight tolerance between the upper and lower rotors 34, 36 and the workpiece 24 helps to provide a controlled and uniform liquid flow. Gases, if used, can purge or confine vapors of the liquids, or provide chemical treatment of the workpiece 24 as well. The spinning movement of the rotors 34, 36 drives the fluids radially outward over the workpiece 24, and into the annular plenum 80 formed in the base 40. From here, the process fluids exit the base 40 via drains 82. The valves 84 control release of the process fluids through fittings 88.

After processing is complete, the actuator 13 lifts the head assembly 28 away from the base assembly 30 by actuating a motor. In the system 10 shown in FIG. 2, the robot 26 moves along the track 23 and uses end-effector 31 to remove the workpiece 24 from the open process chamber 16. The robot 26 then travels along the linear track 23 for further processing of the workpiece 24, or to perform a transport operation at the input/output station 19.

While the present invention has been described in terms of concurrently providing different process fluids to the device and bottom sides of the workpiece, multiple sequential processes of a single workpiece can also be performed using two or more processing fluids sequentially provided through a single inlet. For example, a processing fluid, such as a process acid, may be supplied by the lower process fluid applicator 62 to the lower process chamber 104 for processing the lower surface of the workpiece 24, while an inert fluid, such as nitrogen gas, may be provided to the upper process chamber 102. As such, the process acid is allowed to react with the lower surface of the workpiece 24 while the upper surface of the workpiece is effectively isolated from hydrofluoric acid reactions.

While the process head, process head assembly, chamber assembly, rotors, workpieces and other components are described as having diameters, they can also have non-round shapes. Further, the present invention has been illustrated with respect to a wafer or workpiece. However, it will be recognized that the present invention has a wider range of applicability. By way of example, the present invention is applicable in the processing of flat panel displays, microelectronic masks, and other devices requiring effective and controlled wet chemical processing.

While embodiments and applications of the present invention have been shown and described, it will be apparent to one skilled in the art that other modifications are possible without departing from the inventive concepts herein. The invention, therefore, is not to be restricted except by the following claims and their equivalents.

I claim:

1. An apparatus for processing a workpiece, comprising:
   a process head assembly having a process head with an upper rotor;
   one or more process fluid supply sources connected to the process head assembly;
   a base assembly having a base and a lower rotor;
   the base having a first magnet and the lower rotor having a second magnet, and with the first magnet repelling the second magnet, wherein the upper rotor is engageable with the lower rotor to form a workpiece process chamber.

2. The apparatus of claim 1 further comprising an aspirator connected to an internal cavity formed in the process head for relieving gaseous fluids from the process head assembly.

3. The apparatus of claim 1 further comprising a motor for rotating at least one of the upper and lower rotors.

4. The apparatus of claim 1 further comprising at least one vent aperture formed in the process head assembly.

5. The apparatus of claim 1 further comprising a plurality of vent apertures formed in the process head assembly.

6. The apparatus of claim 1, wherein the lower rotor comprises a plurality of alignment pins for positioning the workpiece in an x-y plane.

7. The apparatus of claim 1, wherein the lower rotor has at least one pin extending from a surface thereof and the upper rotor has at least one bore, wherein the pin engages the bore when the upper and lower rotors are engaged.

8. The apparatus of claim 1, wherein the upper and lower rotors include a plurality of pins for containing the workpiece.

9. The apparatus of claim 1 further comprising one or more process fluid supply sources connected to the base assembly.

10. The apparatus of claim 1, wherein an annular plenum is formed between an interface of the process head assembly and the base assembly.

11. The apparatus of claim 1, wherein the lower rotor comprises an annular member that runs circumferentially about the periphery of the lower rotor that mates with the upper rotor to form a fluid seal.

12. The apparatus of claim 1, wherein at least one annular exhaust channel is formed in the base.

13. The apparatus of claim 1, wherein the process head further comprises:
a head ring connecting the process head and the upper rotor;
a motor coupled to the upper rotor; and
a vent for introducing air into the workpiece process chamber.

14. The apparatus of claim 1, wherein the process head assembly includes a nozzle for introducing a process fluid into the apparatus.

15. The apparatus of claim 14, wherein the process fluid source supplies a fluid selected from the group consisting of nitrogen, isopropylalcohol, water, ozonated water, sulfuric acid, hydrofluoric acid, air, hydrogen peroxide, and ST-250.

16. The apparatus of claim 1 further comprising at least one exhaust port formed in the base.

17. The apparatus of claim 16 further comprising a plurality of exhaust ports formed in the base.

18. The apparatus of claim 1 further comprising a process head assembly lifter for moving the process head assembly relative to the base assembly.

19. The apparatus of claim 18, wherein the process head assembly lifter moves the process head assembly away from the base assembly to an open position.

20. The apparatus of claim 19, wherein the process head assembly lifter moves the process head assembly toward the base assembly so that the upper rotor becomes engaged to the lower rotor.

21. The apparatus of claim 20, wherein the first magnet in the base repels the second magnet in the lower rotor and when the process head assembly lifter moves the process head assembly toward the base assembly, the upper rotor contacts the lower rotor forcing the lower rotor toward the base, forming a contact seal between the upper and lower rotors.

22. The apparatus of claim 1, wherein an annular plenum for collecting process fluids is formed in the base.

23. The apparatus of claim 22, wherein the annular plenum communicates with a drain port formed in the base to drain the process fluids from the process chamber.

24. The apparatus of claim 23 further comprising a valve actuator for opening and closing the drain port.

25. The apparatus of claim 24, wherein a plurality of air inlet holes is formed in the head ring.

26. The apparatus of claim 24, wherein a cavity is formed between the upper rotor and the head ring.

27. The apparatus of claim 26, wherein the cavity formed between the upper rotor and the head ring is connected to a vacuum exhaust.

28. A system for processing a workpiece, comprising:
a plurality of workpiece stations, with at least one station having an apparatus comprising:
a process head assembly having an upper rotor;
a base assembly having a base and a lower rotor;
the upper rotor engageable with the lower rotor to form a workpiece process chamber;
first and second magnets, the first and second magnets creating a force which maintains contact between the upper and lower rotors when the upper and lower rotors are engaged; and
a robot moveable between the workpiece stations for moving a workpiece from one station to another station.

29. The system of claim 28 further comprising a process head assembly lifter associated with the at least one station.

30. The system of claim 28, wherein the magnetic force is created by repulsion between the first and second magnets.

31. The system of claim 28, wherein the upper rotor has an opening through which process fluids are applied to a surface of the workpiece.

32. The system of claim 28, wherein the lower rotor has an opening through which process fluids are applied to a surface of the workpiece.

33. The system of claim 28, wherein the upper rotor and a first surface of the workpiece form an upper process chamber and the lower rotor and a second surface of the workpiece form a lower process chamber.

34. The system of claim 28 further comprising means for connecting the lower rotor to the base.

35. An apparatus for processing a workpiece, comprising:
a process head assembly having a process head with an upper rotor;
a base assembly having a base and a lower rotor, with the lower rotor comprising a plurality of alignment pins for positioning the workpiece in an x-y plane; and
the base having a first magnet and the lower rotor having a second magnet, wherein the upper rotor is engageable with the lower rotor via a magnetic force created by the first and second magnets to form a workpiece process chamber.

36. An apparatus for processing a workpiece, comprising:
a process head assembly having a process head with an upper rotor;
a base assembly having a base and a lower rotor;
one or more process fluid supply sources connected to the base assembly; and
the base having a first magnet and the lower rotor having a second magnet, with the first magnet repelling the second magnet and wherein the upper rotor is engageable with the lower rotor to form a workpiece process chamber.

37. An apparatus for processing a workpiece, comprising:
a process head assembly having a process head with an upper rotor;
a base assembly having a base and a lower rotor;
at least one exhaust port formed in the base; and
the base having a first magnet and the lower rotor having a second magnet repelled by the first magnet, and wherein the upper rotor is engageable with the lower rotor to form a workpiece process chamber.

38. An apparatus for processing a workpiece, comprising:
a process head assembly having a process head with an upper rotor;
a base assembly having a base and a lower rotor;
an annular plenum formed between an interface of the process head assembly and the base assembly; and
the base having a first magnet and the lower rotor having a second magnet, with the first and second magnets acting to hold the lower rotor off of the base, and wherein the upper rotor is engageable with the lower rotor to form a workpiece process chamber.

39. An apparatus for processing a workpiece, comprising:
a process head assembly having a process head with an upper rotor;
a base assembly having a base and a lower rotor;
a process head assembly lifter for moving the process head assembly relative to the base assembly; and
the base having a first magnet having a first polarity and the lower rotor having a second magnet also having the first polarity, and with the upper rotor engageable with the lower rotor to form a workpiece process chamber.

* * * * *